United States Patent
Harada

(10) Patent No.: US 10,014,253 B2
(45) Date of Patent: Jul. 3, 2018

(54) METHOD OF MANUFACTURING SEMICONDUCTOR INTEGRATED CIRCUIT DEVICE

(71) Applicant: SII Semiconductor Corporation, Chiba-shi, Chiba (JP)

(72) Inventor: Hirofumi Harada, Chiba (JP)

(73) Assignee: ABLIC Inc. (JP)

( * ) Notice: Subject to any disclaimer, the term of this patent is extended or adjusted under 35 U.S.C. 154(b) by 0 days.

(21) Appl. No.: 15/818,007

(22) Filed: Nov. 20, 2017

(65) Prior Publication Data
US 2018/0090437 A1    Mar. 29, 2018

Related U.S. Application Data

(62) Division of application No. 15/059,112, filed on Mar. 2, 2016, now Pat. No. 9,831,176.

(30) Foreign Application Priority Data

Mar. 6, 2015 (JP) ................ 2015-044971
Mar. 9, 2015 (JP) ................ 2015-046302
Sep. 30, 2015 (JP) ................ 2015-194573

(51) Int. Cl.
*H01L 21/52* (2006.01)
*H01L 23/525* (2006.01)
*H01L 23/00* (2006.01)

(52) U.S. Cl.
CPC ......... *H01L 23/5258* (2013.01); *H01L 24/00* (2013.01)

(58) Field of Classification Search
CPC .............. H01L 23/5256; H01L 23/528; H01L 23/5226; H01L 23/53228; H01L 21/76877; H01L 23/5283; H01L 21/7682; H01L 23/5329; H01L 27/11206; H01L 21/76816; H01L 23/522; H01L 23/53238
See application file for complete search history.

(56) References Cited

U.S. PATENT DOCUMENTS

2005/0189613 A1    9/2005  Otsuka et al. ............... 257/529
2012/0199942 A1    8/2012  Kageyama et al. .......... 257/529

OTHER PUBLICATIONS

Abstract, Publication No. 10-189737, Publication Date Jul. 21, 1998.

*Primary Examiner* — Robert Bachner
(74) *Attorney, Agent, or Firm* — Adams & Wilks

(57) ABSTRACT

A semiconductor integrated circuit device capable of stably forming a fuse element that is used to adjust the characteristics of the semiconductor integrated circuit device, and a method of manufacturing the semiconductor integrated circuit device are provided. The thickness of an interlayer insulating film above the fuse element is reduced by using an amorphous silicon layer that is formed by sputtering as a material of the fuse element, and by forming the amorphous silicon layer at the same time as metal wiring is formed. The steady ease of laser trimming processing is thus accomplished in the semiconductor integrated circuit device and the method of manufacturing the semiconductor integrated circuit device.

7 Claims, 26 Drawing Sheets

METHOD OF MANUFACTURING SEMICONDUCTOR INTEGRATED CIRCUIT DEVICE

BACKGROUND OF THE INVENTION

1. Field of the Invention

The present invention relates to a semiconductor integrated circuit device configured to use a fuse element for laser trimming to adjust electric characteristics, and a method of manufacturing the semiconductor integrated circuit device.

2. Description of the Related Art

As a resistance element that is used for a voltage dividing circuit of a semiconductor integrated circuit, a diffused resistor that is a monocrystalline silicon semiconductor substrate implanted with impurities having a conductivity type opposite to that of the semiconductor substrate, a resistor formed of polycrystalline silicon implanted with impurities, or the like is used. In designing the voltage dividing circuit, when a plurality of such resistors is used, the resistors are set to have the same length, the same width, and the same resistivity. Then, the respective resistance elements are equally subjected to variations in shape in an etching process in which the shape is determined and to variations in impurity implantation. Therefore, even if the absolute values of the resistance elements vary, resistance ratios between the resistance elements can be maintained at a constant value.

When the resistance elements having a certain resistance value based on the same shape and the same resistivity are used in a voltage dividing circuit, various resistance values are realized through series connection and parallel connection of unit resistance elements 200 such as resistor groups 201 to 204 in FIG. 2. As described above, the unit resistance elements 200 are resistance elements having the same shape and the same resistivity, and thus, the high resistance ratios between the resistor groups each including the unit resistance element (s) can be maintained with high accuracy.

Further, fuses 301 to 304 of, for example, polycrystalline silicon, are formed in parallel with the resistor groups 201 to 204, respectively, so as to be cut by laser radiation from the outside. Depending on whether or not the fuses are cut by the laser radiation, a resistance value between a terminal 109 and a terminal 110 can be changed as necessary. Then, a voltage corresponding to a divided voltage ratio to a fixed resistor formed between the terminal 110 and a terminal 111 is output from the terminal 110.

The structure of the fuses 301 to 304 used in laser trimming of related art is described with reference to FIGS. 3A and 3B.

FIG. 3A is a plan view of the fuses 301 to 304 of FIG. 2 arranged side by side. Each of the fuses has a laser cutting region in which the line width is narrower at the center than at the ends, and has at each end a wiring connection region, which is connected to an internal circuit by metal wiring 8 via a contact hole 7. A laser fuse cutting opening 10 is formed in a region where the fuse elements are cut by laser trimming.

FIG. 3B is a sectional view taken along the line A-A of FIG. 3A. A LOCOS insulating film 13 is formed on a semiconductor substrate 1 to isolate elements from each other. Laser-cut fuse elements are formed on the LOCOS insulating film 13 to a thickness of 2,000 Å to 4,000 Å from a layer of polycrystalline silicon 5 that is the same layer as the one used for a gate electrode of a MOS transistor. As illustrated in the sectional view, the thickness in the laser fuse cutting opening 10 is reduced by treating a portion of the insulating film that is right above the fuses through dry etching, thereby creating a structure that efficiently transmits the energy of a laser for melting the fuses. After the dry etching, the portion of the insulating film that is above the fuses has a desired thickness suitable for laser processing.

The fuse material used here is the polycrystalline silicon 5, which doubles as the gate electrode of the MOS transistor. Accordingly, in the case of a semiconductor manufacturing process in which just one layer of the metal wiring 8 is formed, only a planarization insulating film, which is formed from boron phosphate silicate glass (or borophosphosilicate glass, BPSG) under the one layer of metal wiring, and a final protective film, which is formed from a silicon nitride film, are formed on the fuse elements made of this fuse material. Add to that the silicon nitride film is removed by etching at the same time a pad opening through which a terminal is led out of the semiconductor integrated circuit is opened, which leaves only the BPSG film having a thickness of 1 μm or so above the fuses.

In the case of a semiconductor manufacturing process in which two or more layers of metal wiring are formed, on the other hand, an interlayer insulating film 22 made mainly from a silicon oxide film is further layered above a BPSG film 16 as illustrated in FIG. 3B in order to insulate the metal wiring layers from each other. Assuming that the thickness per layer is approximately 1 μm, the total thickness of insulating films above the fuses increases from that in the single-metal wiring layer process in proportion to the number of wiring layers stacked, and easily amounts to a several-μm-thick silicon oxide film. The total thickness of silicon oxide films above the fuses is even thicker in the case where the final protective film is a two-layer film that has a silicon nitride film as the upper layer and a silicon oxide film as a layer for relieving stress from the underlying metal wiring layer.

The total thickness of silicon oxide films above the fuses that is thus thick hinders laser energy for fuse cutting from being spent efficiently on cutting the fuses, and presents a risk of defective cutting. It is therefore common to avoid defective cutting in laser cutting by reducing the thickness of the silicon oxide film that is the lower layer as well as the thickness of the silicon nitride film that is the upper layer through dry etching as illustrated in the sectional view of FIG. 3B.

A method of forming these fuses made of polycrystalline silicon and a method of processing the insulating films above the fuses are disclosed in, for example, JP 10-189737 A.

However, processing laser-cut fuses that are used in a semiconductor integrated circuit of related art has the following difficulties:

Firstly, in the fuse elements made of polycrystalline silicon that doubles as the gate electrode of the MOS transistor, the trend toward the miniaturization of the semiconductor manufacturing process and the accompanying increase in the number of wiring layers stacked have increased the total thickness of insulating films that are located between the top surface of the semiconductor integrated circuit and the polycrystalline silicon fuse elements, which makes it difficult to cut the fuses by external laser irradiation such as fuse cutting executed to adjust the characteristics of the semiconductor integrated circuit.

The method of removing a given amount of insulating films above the polycrystalline silicon fuse elements through etching and adjusting the remaining insulating films to a given thickness, by adding a step of forming a photomask on the insulating films and a step of performing dry etching on the insulating films, for the purpose of making it easier for a laser beam to reach the fuse elements, also has a problem in that fluctuations in the thickness of the remaining insulating films are greater than when this method is not employed, due to dry etching fluctuations throughout the wafer plane and between wafers, and fluctuations in the thickness itself of each of the stacked interlayer insulating films. In fuse cutting that uses a laser, there is generally a trade-off between the thickness of insulating films above the fuse elements and the ease of processing the fuses in which the insulating films that are too thick hinders efficient transmission of the energy and leaves the fuses uncut, and the insulating films that are too thin transmit the energy to layers below the fuse elements and let a base substrate be damaged, or allow the fuses to remain melted from the fuses' own heat and to reattach to themselves instead of being sublimed. The insulating films therefore have an optimum thickness range in laser fuse cutting. However, the fluctuations in the thickness of the insulating films above the fuses described above sometimes exceed the optimum thickness range, thereby making it difficult to stabilize the ease of laser processing.

The amount of laser energy that reaches the fuse elements and the resultant destabilization of laser processing are exacerbated further by the reflection of an irradiating laser beam at the boundary between interlayer insulating films which increases in number as the number of interlayer insulating films stacked rises, and by fluctuations in the degree of reflection which depends on the condition of the boundary.

The etching mask used to remove the insulating films above the fuses can also pose a problem by being destroyed and inviting etching damage when securing an appropriate etching selectivity of the etching mask with respect to the etched film is difficult and the amount of the film to be etched away is large. This problem arises also when a stopper film for etching which is proposed in JP 10-189737 A is employed.

In addition, because the polycrystalline silicon layer is formed by low-pressure chemical vapor deposition (LP-CVD), which is performed generally at a high temperature of 500° C. to 700° C., a method of reducing the total thickness of insulating films that are piled on fuse elements by forming the fuse elements after a metal wiring layer that is low in melting point or an interlayer insulating film that uses an organic film cannot be employed for fuse elements that are made from this polycrystalline silicon layer.

SUMMARY OF THE INVENTION

Therefore, it is an object of the present invention to provide a semiconductor integrated circuit device using a fuse element for laser trimming and a method of manufacturing the integrated semiconductor circuit device in which the thickness of an insulating film above a fuse is reduced by using a silicon-based film as a fuse material and setting a step of forming the fuse close to a step of forming a final protective film, and fuse cutting with the use of a laser is stabilized without needing a high level of dry etching stabilization control.

In order to solve the above-mentioned problems, according to one embodiment of the present invention, there is provided a semiconductor integrated circuit device, including: a semiconductor substrate; an insulating film formed on the semiconductor substrate; two conductors made of metal and disposed at a distance from each other on the insulating film; a first high-melting point metal film layered on the two conductors; and a fuse element made from an amorphous silicon layer, which is formed in a region above the insulating film where the two conductors are spaced apart from each other, and is configured to cover a top surface of the first high-melting point metal film and side surfaces of the two conductors.

Further, in the semiconductor integrated circuit device according to the one embodiment of the present invention, a second high-melting point metal film, which has the same shape in plan view as a shape of the amorphous silicon layer, is formed under the amorphous silicon layer.

Further, in the semiconductor integrated circuit device according to the one embodiment of the present invention, the semiconductor integrated circuit device includes at least two metal wiring layers, the two conductors include a last metal wiring layer, which is the highest layer out of the at least two metal wiring layers, and, above the last metal wiring layer, a protective film is formed.

Further, in the semiconductor integrated circuit device according to the one embodiment of the present invention, the protective film includes a silicon oxide film and a silicon nitride film formed above the silicon oxide film, and the silicon nitride film is removed from above the fuse element to form an opening.

In order to solve the above-mentioned problems, according to one embodiment of the present invention, there is further provided a method of manufacturing a semiconductor integrated circuit device including a fuse element, the method including:

forming an insulating film on a semiconductor substrate;

layering on the insulating film a first metal film and a first high-melting point metal film in the order stated;

etching the first metal film and the first high-melting point metal film to form, in a fuse element region, two conductors in which the first high-melting point metal film is placed on top of the first metal film and which are spaced apart from each other, and to form a bonding pad in a bonding pad region;

forming an amorphous silicon layer by deposition on the two conductors, the bonding pad, and the insulating film;

forming, in the fuse element region, a fuse element from the amorphous silicon layer, which is formed in a region above the insulating film where the two conductors are spaced apart from each other, and is configured to cover a top surface of the first high-melting point metal film and side surfaces of the two conductors;

removing the amorphous silicon layer and the first high-melting point metal film from the bonding pad region;

forming, by deposition, over the semiconductor substrate that includes the fuse element, a protective film in which a silicon oxide film constitutes a lower layer and a silicon nitride film constitutes an upper layer; and removing the protective film from above the bonding pad.

Further, in the method of manufacturing a semiconductor integrated circuit device according to the one embodiment of the present invention, in removing the protective film, the silicon nitride film is removed from above the fuse element.

Further, there is provided the method of manufacturing a semiconductor integrated circuit device according to the one embodiment of the present invention, further including forming a second high-melting point metal film by deposition, prior to the forming of the amorphous silicon layer by deposition, in which, in forming the fuse element, the fuse element is formed in the fuse element region from the second high-melting point metal film and from the amorphous silicon layer, which is formed in a region above the insulating film where the two conductors are spaced apart from each other, and is configured to cover a top surface of the first high-melting point metal film and side surfaces of the two conductors.

According to the one embodiment of the present invention, a high-yield semiconductor integrated circuit device superior in long-term reliability and a method of manufacturing the integrated semiconductor circuit device are provided in which stable fuse cutting with the use of a laser is accomplished by forming the fuse element from a silicon-based film and setting the step of forming the fuse element closer to a step of forming a final protective film than as in related art.

DETAILED DESCRIPTION OF THE INVENTION

The present invention provides a semiconductor integrated circuit device including a fuse circuit for laser trimming that has a fuse structure capable of solving the difficulties encountered in related art with regards to the ease of laser cutting processing, by balancing the stabilization of the thickness of an insulating film above a fuse element and the use of a fuse element material easily cut with a laser, and a method of manufacturing the semiconductor integrated circuit device.

Embodiments of the present invention are described below with reference to the drawings.

First Embodiment

Figure 1A:
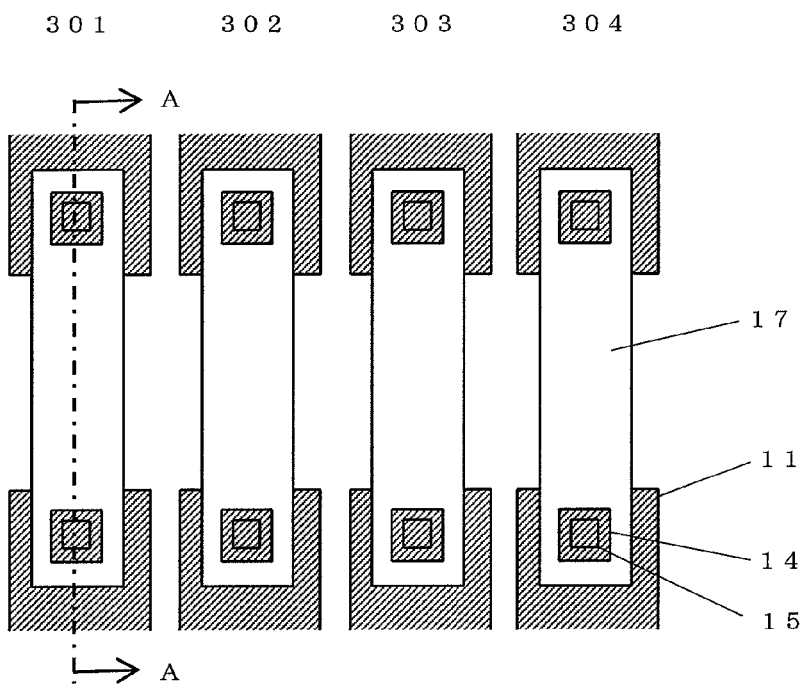
FIG. 1A and FIG. 1B are a schematic plan view and a schematic sectional view, respectively, of a first embodiment of the present invention.
Figure 1B:
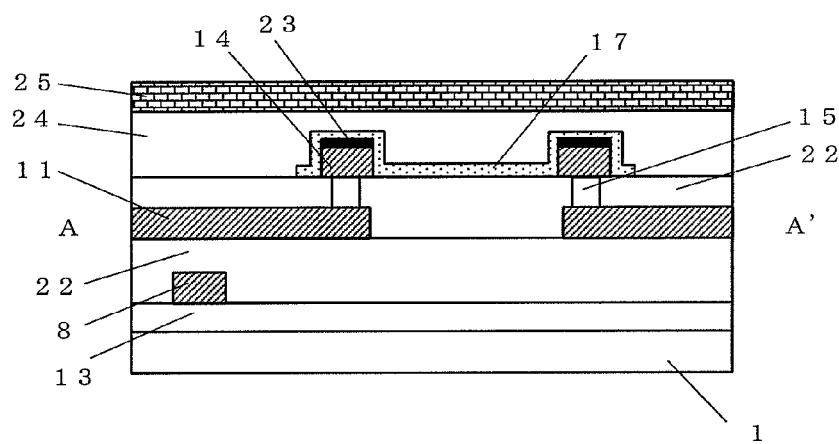
Figure 2:
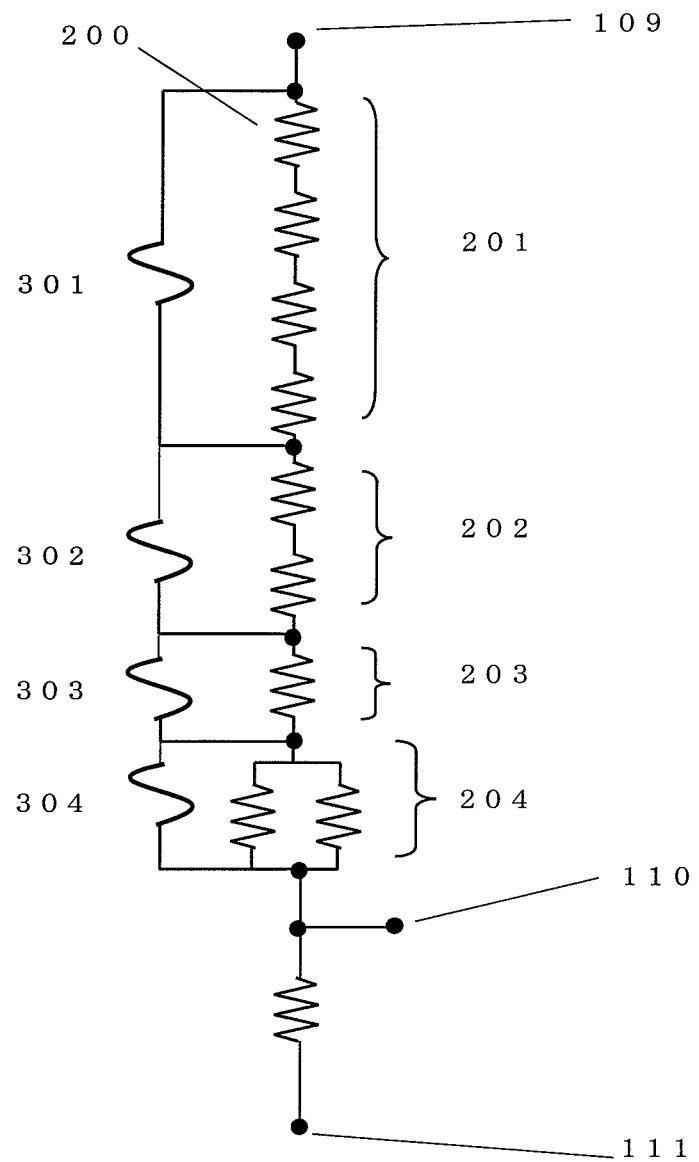
FIG. 2 is a diagram of an example of a voltage dividing circuit in which resistor elements are used in combination.
Figure 3A:
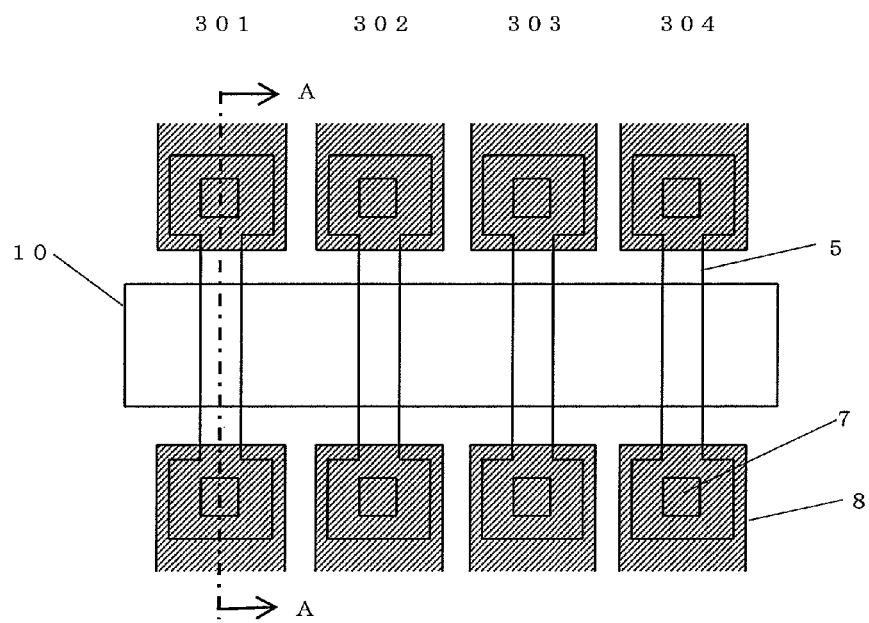
FIG. 3A and FIG. 3B are a schematic plan view and a schematic sectional view, respectively, for illustrating the structure of a fuse element of related art.
Figure 3B:
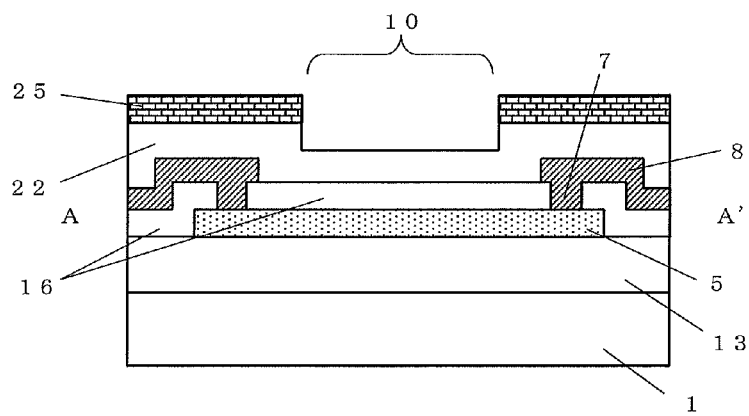

FIG. 1A and FIG. 1B are a schematic plan view and a schematic sectional view, respectively, of a first embodiment of the present invention for illustrating an example where a three-metal wiring layer process is used. FIG. 1A relates to fuse elements in which an amorphous silicon layer 17 is formed by sputtering in place of a polycrystalline silicon layer that is formed by LPCVD in related art. At the top end and bottom end of each of the fuse elements in the drawing, two conductors are formed from third-layer metal wiring 14 to connect to second metal wiring layer 11, which leads to an internal circuit. A via hole 15 is also formed at the top end and bottom end of each fuse element to connect the third metal wiring layer 14 and the second metal wiring layer 11. The amorphous silicon layer 17 is laid out so as to overlap well in plan view with the third metal wiring layer 14, which forms the two conductors, and with the via hole 15. Though not shown, the first metal wiring layer, the second metal wiring layer, and the third metal wiring layer are formed by a common semiconductor manufacturing process for minute processing. For example, the metal of a conductor used in the metal wiring layers is Al doped with Si or Cu, or is Cu, a barrier metal that is a high-melting point metal such as Ti or TiN is disposed on the bottom surface of the conductor, and an anti-reflection film made of TiN or the like is layered on the top surface of the conductor. An anti-reflection film 23 for the third metal wiring layer 14 which relates strongly to the present invention is shown in FIG. 1B. The high-melting point metal used is not limited to Ti or TiN, and other Ti compounds can be used.

FIG. 1B is a sectional view of a fuse element 301 taken along the line A-A in FIG. 1A. The fuse element 301 in this embodiment is provided on the interlayer insulating film 22 that covers the second metal wiring layer. A silicon oxide film 24 and a silicon nitride film 25 are stacked on the amorphous silicon layer 17 as a two-layer protective film. While the amorphous silicon layer is formed at the time of forming the last metal wiring layer in this example, when to form the amorphous silicon layer is not limited to the time of forming the last wiring layer, and may be synchronized with the time when a metal wiring layer below the last wiring layer is formed.

In the structure of the present invention that is illustrated in FIG. 1B, the ends of the amorphous silicon layer 17 which forms the fuse elements are formed so as to be in contact with side surface portions and top surface portions of the two conductors in order to make the areas of contact between the fuse elements and the wiring large and to achieve a stable contact resistance.

The via hole 15 for establishing contact with the second metal wiring layer 11 is further formed immediately below the third metal wiring layer pattern. Electrical connection to the second metal wiring layer 11 is made through an embedded metal inside the via hole, such as tungsten, and the wiring is led therefrom to the internal circuit.

Unlike the example of related art in which a polycrystalline silicon layer is formed prior to a wiring layer forming step, the present invention uses a silicon target and sputtering to fabricate fuse elements in the process of forming a metal wiring layer that is not the first metal wiring layer, instead of LPCVD, which involves high-temperature treatment at 500° C. or higher. Setting the temperature at which the film for the fuses is formed by sputtering to 200° C. or less avoids damaging the wiring layers and the interlayer insulating films that are already formed. This means that the forming of the fuse film can be timed with the forming of any of the wiring layers in the process of forming multiple metal wiring layers, which is advantageous in terms of the degree of freedom in manufacture process.

In addition, sputtering, unlike CVD, is advantageous when a thin film is formed by deposition, and can easily form a film as thin as 1,000 Å or less by deposition. While plasma CVD or the like is low-temperature treatment that can be performed at 500° C. or less and is accordingly a manufacturing method suitable for mass production, there are stability concerns when a film of 1,000 Å or less is formed by plasma CVD or the like. Sputtering is capable of making the fuse film even thinner while preventing damage to the surrounding elements and the underlying layers by decreasing fusion energy of the laser. With the laser energy decreased, dimension margins to absorb laser damage in the plane direction and the vertical direction can be reduced, and the reduction in size of the semiconductor integrated circuit contributes to the lowering of cost.

However, the amorphous silicon layer that is less than 150 Å in thickness generally diffuses into the underlying Al layer during subsequent heat treatment around 400° C., such as a plasma CVD step for forming the final protective film, and the contact resistance between Al in a fuse connection portion and the amorphous silicon layer rises markedly. The diffusion of the amorphous silicon layer is not a problem above the Al wiring here because the anti-reflection film 23 made of high-melting point metal such as TiN is left above the third wiring layer 14 in FIG. 1A and FIG. 1B. The side surfaces of the Al wiring, on the other hand, are in direct contact with the amorphous silicon layer but, unlike the top face of the AL wiring, have oxygen and carbon adhering thereto that are by-products of dry etching processing and that suppress the diffusion of the amorphous silicon layer into the Al wiring. Structured as above, the amorphous silicon layer that is used in the present invention is capable of achieving a stable contact resistance with metal wiring by setting the target thickness of the amorphous silicon layer to 150 Å or more, even allowing for a thickness fluctuation of about 10%.

When an insulator target material is formed into a film by sputtering on a semiconductor substrate, it is difficult to control the electric potential of the insulator. An amorphous silicon target material to be formed into a film by sputtering as in the present invention is therefore usually doped with an impurity such as phosphorus or boron to raise the impurity concentration and lower the resistivity. For that purpose, a target material having a resistivity of, for example, 0.01 Ω·cm or less is commonly used to serve as a conductor for the fuse element. In the case where making the silicon film thin pushes the per-unit area sheet resistance to an unignorable level, the length or width of the fuse element is adjusted to accomplish a desired fuse resistance.

A low-resistivity silicon thin film can also be achieved by implanting an impurity through ion implantation or the like after forming a high-resistivity silicon thin film that contains no impurities. This method, however, requires heat application in a sufficient amount to activate the impurity, and cannot avoid damage from the heat to the Al-based wiring layer and the interlayer insulating films. It is therefore difficult to fabricate a low-resistance fuse element from a silicon-based material after metal wiring and interlayer insulating films are formed, by other methods than one in which a target high in impurity concentration and low in resistivity is prepared and formed into a film by sputtering as in the present invention.

The laser cutting opening in the example of related art is not particularly formed in FIG. 1B. The reason is that, because the amorphous silicon layer for use as fuse elements is formed at the same time as the last metal wiring layer as described above, which means no extra layer in the form of an inter-wiring layer insulating film right above the amorphous silicon layer, the final protective film provides a thickness suitable for cutting the fuses by a laser. This is equivalent to the single-metal wiring layer process of related art where there is no problem with the ease of laser cutting processing, although there are still fluctuations in the forming of the silicon oxide film 24 and the silicon nitride film 25, and, on the other hand, this is free of the fluctuations in the thickness of insulating films above the fuses which originates from fluctuations in dry etching for the opening. Stable laser processing is accomplished as a result. In addition, this reduces layout dimension margins that are allowed for in related art, such as margins for fluctuations in the positioning of a laser cut opening pattern with respect to a laser irradiation spot and margins for the positioning of the laser cut opening with respect to the metal wiring, and accordingly contributes to a reduction in area required for the fuse element portion.

Furthermore, forming the laser cutting opening means that the silicon nitride film, which has excellent moisture resistance, is removed from that portion, and leads to a chance that moisture may seep into the semiconductor integrated circuit through the silicon oxide film in the opening to cause deterioration in long-term reliability such as the corrosion of wiring and changes in characteristics. The first embodiment of the present invention, where the only opening remaining in the silicon nitride film is a hole having the diameter of the laser that is formed during the laser cutting of the fuse element, has another advantage in that the adverse effect on long-term reliability is minimized.

While the fuse elements in this example are wired by the third metal wiring layer and the second metal wiring layer in the three-metal wiring layer semiconductor manufacturing process, the same effect can be obtained by forming the fuse elements and wiring of the fuse elements with the use of the second metal wiring layer and the first metal wiring layer in the two-wiring layer process. In the case of the single-metal wiring layer semiconductor manufacturing process, the same effect can be obtained by, though not shown, using the first metal wiring layer and high-concentration diffusion wiring on the silicon substrate. The present invention is thus applicable to semiconductor manufacturing processes of various wiring configurations, from single-wiring layer processes to multi-wiring layer processes, and can be said to have a high degree of freedom in selecting a semiconductor manufacturing process.

As has been described, the first embodiment of the present invention is capable of providing an inexpensive semiconductor integrated circuit that achieves high quality by enhancing the stability of laser cutting processing of a fuse element from the level of stability in related art and by thus minimizing a drop in yield and the decline of long-term reliability, and that requires less area for the fuse element and the surroundings of the fuse element.

Second Embodiment

Figure 4A:
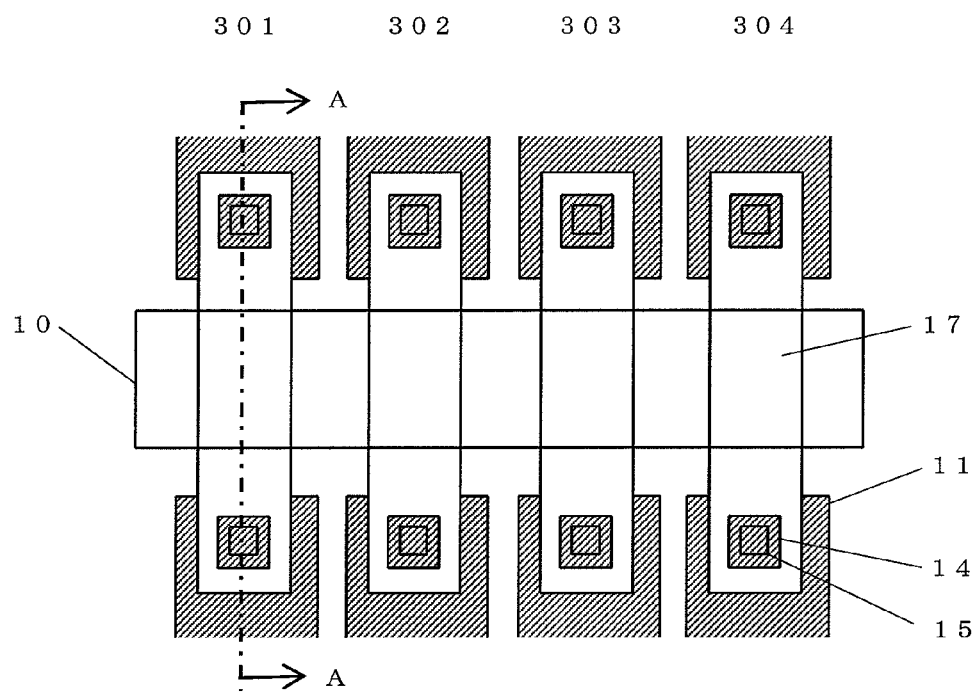
FIG. 4A and FIG. 4B are a schematic plan view and a schematic sectional view, respectively, of a second embodiment of the present invention.
Figure 4B:
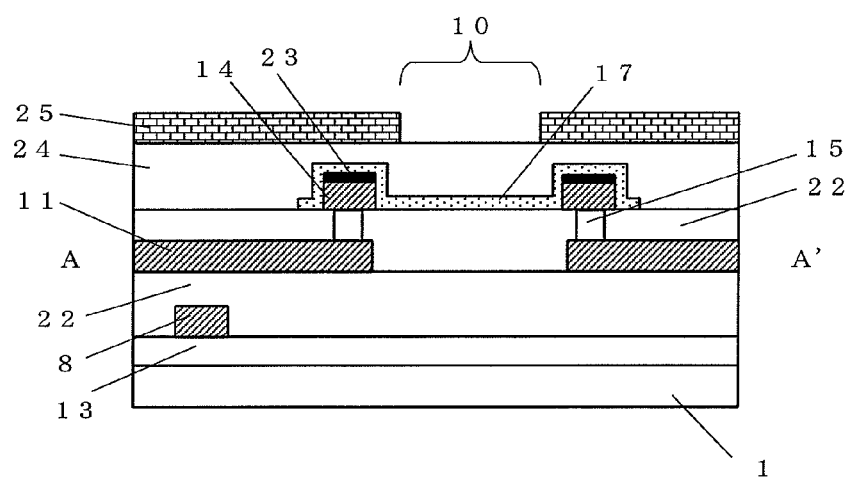

FIG. 4A and FIG. 4B are a schematic plan view and a schematic sectional view, respectively, of a second embodiment of the present invention for illustrating an example where a three-metal wiring layer process is used as in the first embodiment. The second embodiment differs from the first embodiment in that a laser fuse cutting opening 10 is formed in a laser fuse cutting-scheduled region as illustrated in FIG. 4A. A portion of a silicon nitride film serving as a final protective film that is immediately above the fuse element 301 is removed by dry etching as illustrated in FIG. 4B, which is a sectional view of the fuse element 301 taken along the line A-A in FIG. 4A.

A final protective film that mainly includes a silicon nitride film may vary in thickness depending on how a semiconductor factory where the semiconductor integrated circuit device is manufactured is set up, on the characteristics of the semiconductor process used, and also on what material, conditions, heat treatment, and the like are used. For example, in the case where the last metal wiring layer is formed thick in order to allow a large amount of current to flow, the final protective film, which is in contact with the last metal wiring layer, needs to be set even thicker in order to adjust a stress balance between this wiring layer and the protective film. In the case where the final protective film above the fuse element is left intact as in the first embodiment of the present invention and the thickness of the final protective film hinders the transmission of a sufficient amount of laser energy for fuse cutting to the fuse element, it is preferred to secure the ease of laser processing by removing the silicon nitride film, which is the upper-layer protective film out of the two-layer protective film, as in the second embodiment. In this case, it is easy to satisfactorily reduce fluctuations in the diminishing of the silicon oxide film, which is the lower layer out of the two-layer protective film, in the dry etching of the silicon nitride film, which is the upper layer out of the two-layer protective film, by setting the etching selectivity with respect to the silicon oxide film to a ratio of 10:1 or higher, and, unlike the example of related art, increased fluctuations in the thickness of the remaining silicon oxide film do not markedly deteriorate the ease of laser processing.

As in the example of related art, forming the laser cut opening 10 means that a portion of the silicon nitride film serving as the final protective film is removed from the opening and leads to a chance of deterioration in long-term reliability.

For example, the laser-cut surface of a fuse element is generally exposed in the opening. If this fuse element happens to be exposed to high-temperature moisture that contains an electrolyte such as an ion while a high voltage of several tens V or higher is being applied to the fuse element, electrical energy promotes chemical reaction on the laser-cut surface, thereby causing silicon to bond with oxygen in the moisture, transform into a silicon oxide film, and expand. In the case where the expansion stress cannot be absorbed, a crack or a brake can be caused around the fuse element, thereby accelerating the seeping of moisture to the inside and letting the erosion advance inward. The fuse elements used in the present invention, however, are thinner than the 2,000 Å to 4,000 Å-thick polycrystalline silicon layer of related art which doubles as a gate electrode, and is set to a thickness of 150 Å to 1,000 Å with the use of sputtering to reduce the area of the cut surface of the fuse to ¼ of that in related art or less. The present invention is accordingly reduced in the area of the laser-cut section where the chemical reaction occurs and can control the degree of stress caused by the chemical reaction, which gives the present invention an advantage over the example of prior art in that the advance of erosion inward is decreased.

As has been described, the second embodiment of the present invention is capable of keeping the ease of laser cutting processing of fuse elements stable even when the silicon nitride film serving as a final protective film is thick, by forming a laser cutting opening in the final protective film, and is therefore reduced in the decline of long-term reliability than in the method of related art.

Third Embodiment

Figure 5A:
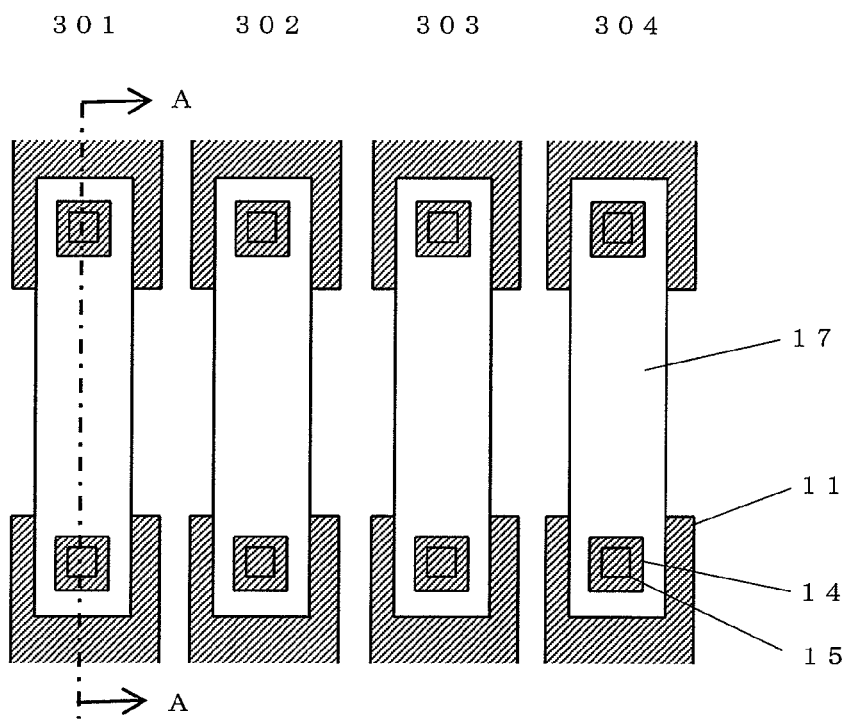
FIG. 5A and FIG. 5B are a schematic plan view and a schematic sectional view, respectively, of a third embodiment of the present invention.
Figure 5B:
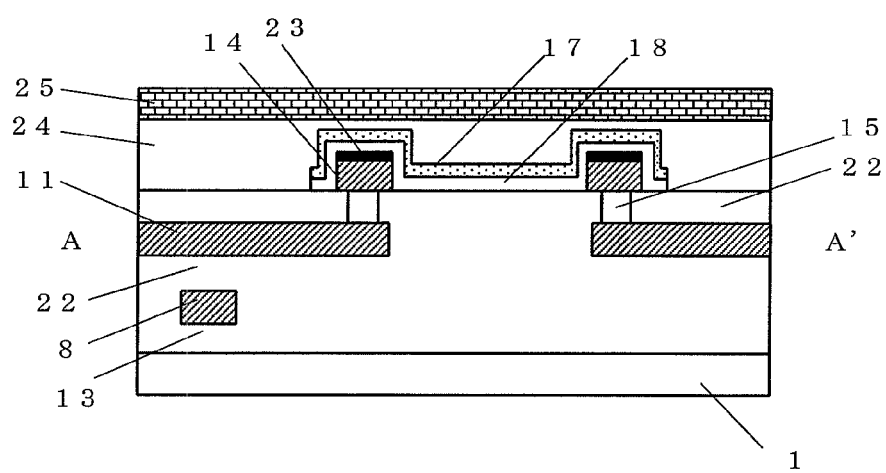

FIG. 5A and FIG. 5B are a schematic plan view and a schematic sectional view, respectively, of a third embodiment of the present invention for illustrating an example where a three-metal wiring layer process is used as in the first embodiment.

The third embodiment differs from the first and second embodiments of FIG. 1A and FIG. 1B in that a second high-melting point metal film 18 is layered under the amorphous silicon layer 17. The two stacked films are formed at once by dry etching processing with the use of the same mask pattern, and therefore have the same shape in plan view, with no particular difference between the two in the plan view of FIG. 5A.

As illustrated in FIG. 5B, which is a sectional view taken along the line A-A in FIG. 5A, the high-melting point metal film 18 is in contact with the metal wiring layer 14, which forms two conductors at the ends of the fuse, and with the anti-reflection film 23, which is a layer formed above the metal wiring layer 14 from a high-melting point metal as the film 18 is, to contribute to the reduction of contact resistance. The high-melting point metal film 18 particularly has an effect of reducing the concern for the diffusion of the amorphous silicon layer into Al which may occur on the side surfaces of the metal wiring layer 14 made of Al, as the anti-reflection film 23 does for the top face of the metal wiring layer 14. The high-melting point metal film 18 thus lifts restrictions on making the amorphous silicon layer 17 thin.

The fuse elements in the first embodiment and the second embodiment are formed solely from the amorphous silicon layer. In the case where making the amorphous silicon layer thin raises the resistance to an unignorable value, or in the case where the semiconductor integrated circuit device is sensitive to a difference in resistance value that results from whether the fuse element is cut or uncut, putting a film of a high-melting point metal such as TiN under the amorphous silicon layer 17 lowers the resistance value of the fuse element significantly. The amorphous silicon layer and the TiN layer are both commonly used as anti-reflection films for metal wiring, and adding this high-melting point metal layer does not bring harmful results or side effects to the metal wiring or the surrounding elements, and does not impair the ease of laser cutting processing. Forming a fuse element from TiN alone in related art tends to make the ease of laser cutting processing unstable due to the high melting point of TiN and the thinness of the TiN film. The present invention, where the two-layer structure made up of an upper amorphous silicon layer and a lower TiN layer is employed so that the amorphous silicon layer absorbs and accumulates the laser energy to generate heat, has an advantage in that the underlying TiN layer is cut more efficiently than in related art. In this manner, advantages of a high-melting point metal can be taken also when a high-melting point metal is used as a fuse element material, without impairing the stability of laser cutting.

As has been described, the third embodiment of the present invention is capable of providing an inexpensive semiconductor integrated circuit that achieves high quality by enhancing the stability of laser cutting processing of a fuse element from the level of stability in related art while giving the fuse element a low resistance, and by thus minimizing the decline of reliability, and that requires less area for the fuse element and the surroundings of the fuse element.

Fourth Embodiment

Figure 6A:
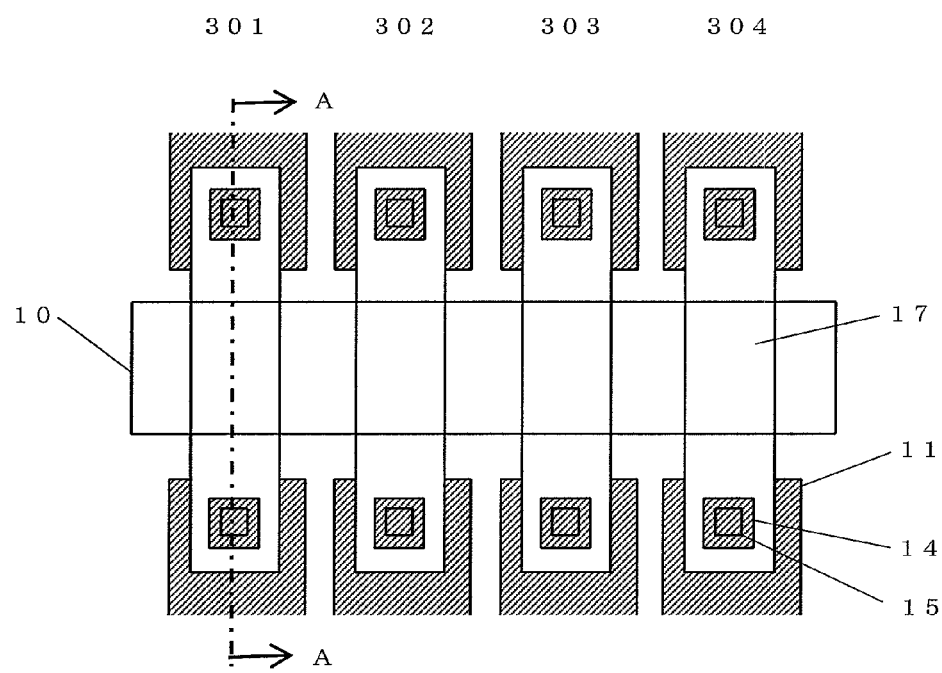
FIG. 6A and FIG. 6B are a schematic plan view and a schematic sectional view, respectively, of a fourth embodiment of the present invention.
Figure 6B:
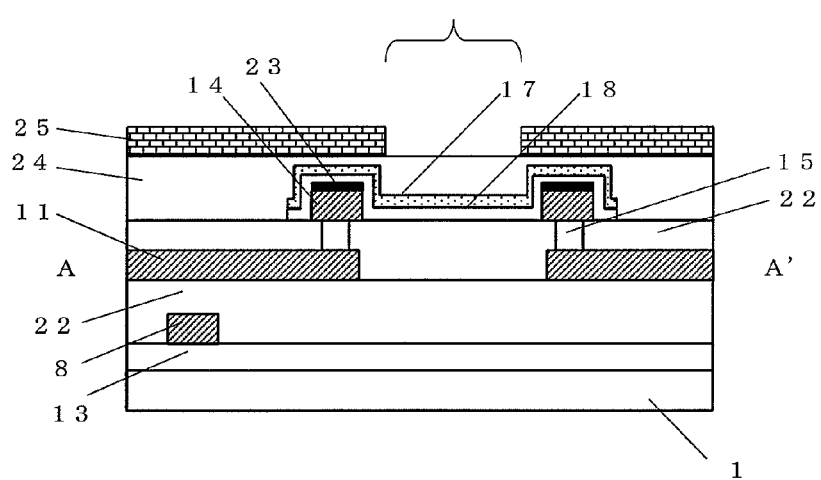

FIG. 6A and FIG. 6B are a schematic plan view and a schematic sectional view, respectively, of a fourth embodiment of the present invention for illustrating an example where a three-metal wiring layer process is used as in the first to third embodiments. In the fourth embodiment, forming the laser fuse cutting opening 10 in a laser fuse cutting-scheduled region as illustrated in FIG. 6A is added to the third embodiment, and only a portion of the silicon nitride film serving as a final protective film that is immediately above the fuse element 301 is removed by dry etching as illustrated in FIG. 6B. FIG. 6B is a sectional view of the fuse element 301 taken along the line A-A in FIG. 6A.

The purpose and effects of the fourth embodiment are the same as those in the second embodiment, and the fourth embodiment is an application, to the third embodiment, of a mode designed for the case where the silicon nitride film 25 of the final protective film is thick and this thickness hinders the transmission of laser energy to the fuse in fuse cutting.

Configured as this, the fourth embodiment of the present invention is capable of keeping the ease of laser cutting processing of fuse elements stable even when the silicon nitride film serving as a final protective film is thick, by forming a laser cutting opening in the final protective film, and is therefore reduced in the decline of long-term reliability than in the method of related art.

Fifth Embodiment

Figure 13:
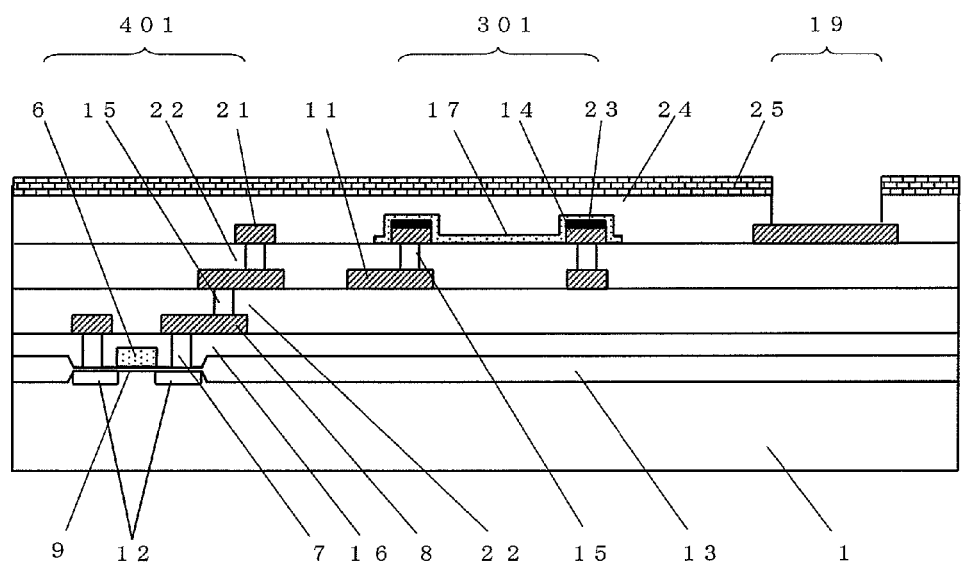
FIG. 13 is a schematic sectional view of a fifth embodiment of the present invention.

FIG. 13 is a schematic sectional view of a fifth embodiment of the present invention as an application of the first embodiment illustrated in FIG. 1A and FIG. 1B which covers the periphery of a fuse element in the semiconductor integrated circuit device as well. Illustrated in FIG. 13 is an example in which a three-metal wiring layer process is used as in the first to fourth embodiments.

In FIG. 13, one of the fuse elements in the first embodiment of the present invention described above is denoted by 301. In addition to the fuse element 301, a bonding pad 19 through which electrical connection to an external terminal is made, an NMOS transistor 401 as an example of the internal circuit, and wiring in the surroundings thereof are illustrated in FIG. 13.

The fuse element 301 is formed from the amorphous silicon layer 17 to which the first embodiment is applied. The third metal wiring layer 14 made of Al and the anti-reflection film 23 made of a high-melting point metal such as TiN are disposed at the ends of the fuse element 301. The second metal wiring layer 11 connects the fuse element 301 to the internal circuit from a layered film in which the metal wiring layer 14 and the anti-reflection film 23 are stacked, through the via hole 15 (the connection is not shown).

The NMOS transistor 401, which is given as an example of the internal circuit, includes an N-type source/drain region 12, a gate insulating film 9, and a gate electrode 6. The NMOS transistor 401 electrically connects to other elements and circuits through the contact holes 7, the first metal wiring layer 8, the via vole 15 in the interlayer insulating film 22 that connects the first metal wiring layer and the second metal wiring layer, the second metal wiring layer 11, the via holes 15 in another interlayer insulating film that connects the second metal wiring layer and the third metal wiring layer, and internal circuit fine metal wiring 21, which is the third metal wiring layer.

The interlayer insulating films 22 are ones used in common semiconductor processes, and are made mainly from a silicon oxide film. The surface levelness of the interlayer insulating films 22 is maintained by treating a tetraethyl orthosilicate (TEOS) film or a spin-on glass (SOG) film with a planarization technology such as etch back or chemical-mechanical polishing (CMP).

Similarly, the first metal wiring layer and the second metal wiring layer are formed by a common semiconductor manufacturing process for minute processing to have a structure common in such manufacturing processes. For example, the metal of a conductor used in the metal wiring layers is Al doped with Si or Cu, or is just Cu. A barrier metal that is a high-melting point metal such as Ti or TiN is disposed on the bottom surface of the conductor to enhance the ease of contact with the underlying metal layer or silicon substrate, and also to improve the long-term reliability of the wiring. An anti-reflection film made of high-melting point metal such as TiN is layered on the top surface of the conductor in order to prevent reflection of light that is used in photolithography processing at the surface of the conductor. In short, the fifth embodiment employs general wiring materials and layered structure based on a fine rule of the semiconductor manufacturing process used. The common technologies used here are irrelevant to the present invention, and details thereof are omitted to show a simplified mode in the drawing.

The internal circuit fine metal wiring 21 as the third metal wiring layer to which the fine rule used for the wiring of the internal circuit is applied, on the other hand, is original to the present invention. Although the metal conductor and barrier metal of the internal circuit fine metal wiring 21 are fabricated by a common manufacturing process to have a common structure as in the first metal wiring layer and the second metal wiring layer, and an anti-reflection film is formed above the conductor to be utilized in the forming and processing of the third metal wiring layer, the anti-reflection film is ultimately removed as illustrated in FIG. 13, which makes the internal circuit fine metal wiring 21 different from the third metal wiring layer at the ends of the fuse element 301. This applies to all other third metal wiring layers than the third metal wiring layer that is used for electrodes at the ends of the fuse element 301, which is a characteristic of the fifth embodiment. Removing the anti-reflection film ultimately does not particularly pose a problem because the anti-reflection film is in place during the photolithography processing when the anti-reflection film is needed.

An anti-reflection film above metal wiring which is used in the processing of the metal wiring is generally layered on a metal film made of Al or Cu right after the metal film is formed as a conductor of the metal wiring by deposition, and the piled layers are both processed at once by photolithography and dry etching. During the exposure to light in photolithography, the anti-reflection film prevents light that is reflected at the metal conductor from entering an unintended place and resultant deforming or breakage of the pattern.

The anti-reflection film and the conductor consequently remain as a unitary component after the etching processing in this type of manufacturing method. In the present invention, however, all of the anti-reflection film except a portion for the fuse element is removed when the fuse element is subsequently processed, thus forming the structure of FIG. 13.

The fuse element can be fabricated also by a method in which an interlayer insulating film is formed between the fuse element and the third metal wiring layer, and a via hole or the like connects the fuse element and the third metal wiring layer. This leaves the anti-reflection film above all parts of the third metal wiring layer. In the present invention, the step of layering the interlayer insulating film and the step of forming the via hole may be omitted by forming the fuse element directly after the third metal wiring layer is formed and processed. One of the reasons that the anti-reflection film is not present above the third metal wiring layer, except for a portion where the fuse element is located, is the manufacturing-related reason described above.

In the bonding pad 19 of FIG. 13 through which electrical connection inside the semiconductor integrated circuit is led out of the semiconductor chip, the third metal wiring layer, which is the last metal wiring layer the same as internal circuit fine metal wiring 21, is disposed to connect a bonding wire, and an opening is formed in the silicon oxide film 24 and the silicon nitride film 25 in a region where the silicon oxide film 24 and the silicon nitride film 25 constitute a portion of the final protective film that is immediately above the disposed third metal wiring layer. Common technologies irrelevant to the present invention are used here to create a wiring connection structure for connecting to the internal circuit beyond the bonding pad, which is made from the third metal wiring layer. Details thereof are therefore omitted to show a simplified mode in the drawing.

An anti-reflection film such as a TiN film for the third metal wiring layer that is used in the bonding pad 19 is removed, as is the case for the third metal wiring layer 21, which is used as the internal circuit fine metal wiring. This presents the following advantage over related art:

Even though the forming and processing of the bonding pad involves layering an anti-reflection film on the third metal wiring layer for a reason connected to the manufacturing process of related art, a portion of the anti-reflection film that is exposed in an opening formed above the bonding pad portion in the final protective film is removed when the opening is formed by dry etching, to thereby improve in subsequent steps the ease of contact with a testing probe and the adhesion of the bonding wire. Still, the anti-reflection film remains above the metal layer that is under the final protective film around the opening in the final protective film, and a section of the anti-reflection film is exposed from the section of the opening in the final protective film.

Ti-based films are generally susceptible to oxidation from heat, moisture, and the like. If a Ti-based anti-reflection film that is exposed is kept in contact with, for example, a water current that is used in dicing for a long period of time, the Ti-based film is oxidized and expanded, thereby lifting the final protective film. The seeping of moisture to the inside may consequently be accelerated to induce the corrosion of metal wiring and changes in characteristics, though this does not occur often.

The fifth embodiment of the present invention, where the anti-reflection film is not left above the third metal wiring layer except for a portion where the fuse element is located and the anti-reflection film is removed also from the bonding pad, has an advantage in that poor quality and the decline of long-term reliability are prevented.

As has been described, the fifth embodiment of the present invention is capable of providing a fuse element that is superior in long-term reliability and that is reduced in manufacturing cost because steps of forming and processing an additional interlayer insulating film are unnecessary, and providing a semiconductor integrated circuit device that includes the fuse element.

Sixth Embodiment

Figure 14:
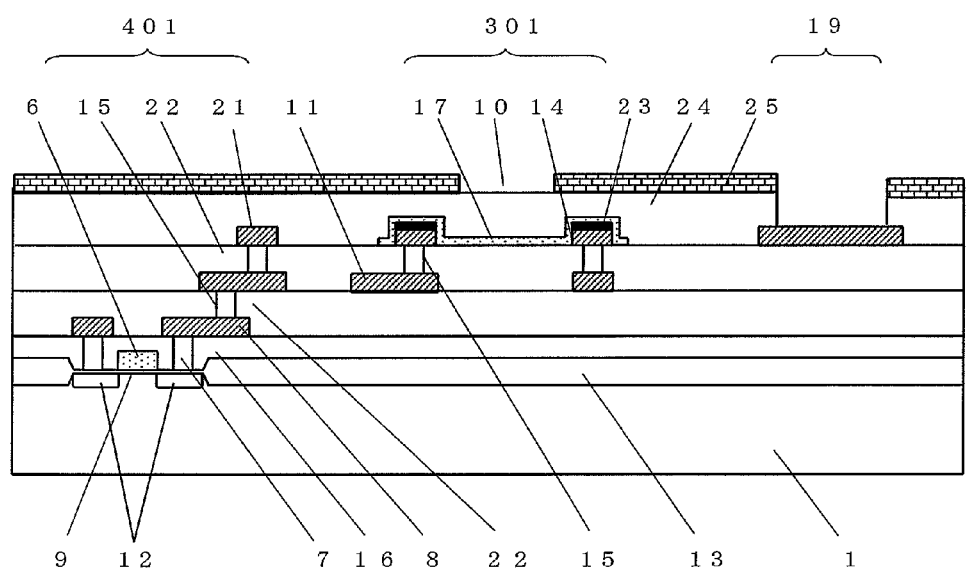
FIG. 14 is a schematic sectional view of a sixth embodiment of the present invention.

FIG. 14 is a schematic sectional view of a sixth embodiment of the present invention as an application of the second embodiment illustrated in FIG. 4A and FIG. 4B which covers the periphery of a fuse element in the semiconductor integrated circuit device as well. Illustrated in FIG. 14 is an example in which a three-metal wiring layer process is used as in the first to fifth embodiments.

The NMOS transistor 401 and wiring in the surroundings thereof, the fuse element 301, and the bonding pad 19 are illustrated in FIG. 14 as in the fifth embodiment. The structures themselves of the NMOS transistor 401, the bonding pad 19, and the fuse element 301 are the same as the ones in the fifth embodiment. In the sixth embodiment, an opening is formed in both of the silicon oxide film 24 and the silicon nitride film 25, which constitute a two-layer final protective film, in the bonding pad 19 by dry etching, whereas an opening is formed only in the silicon nitride film in a portion of the final protective film that is above the fuse element. In the case where a final protective film that is thick for a manufacturing-related reason hinders the transmission of a laser used for fuse cutting and impairs the ease of laser processing of the fuse element as described in the second embodiment, a photomask for the fuse opening in the final protective film is prepared and processed separately from a bonding pad opening mask in this manner.

As has been described, the sixth embodiment of the present invention is capable of realizing a semiconductor integrated circuit device in which the ease of fuse cutting processing is stable even when the final protective film is too thick to transmit a laser for fuse cutting, and the long-term reliability is high.

Seventh Embodiment

Figure 7:
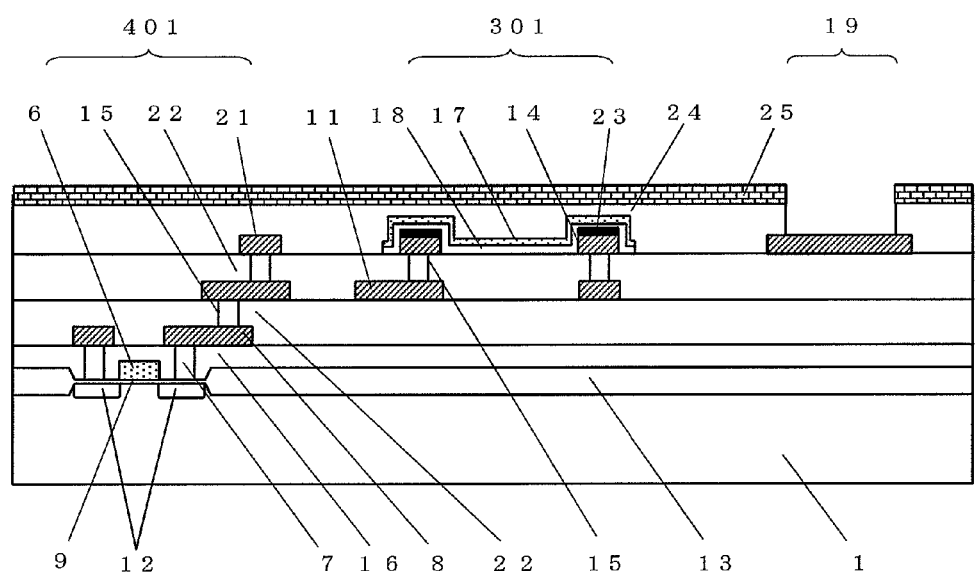
FIG. 7 is a schematic sectional view of a seventh embodiment of the present invention.

FIG. 7 is a schematic sectional view of a seventh embodiment of the present invention as an application of the third embodiment illustrated in FIG. 5A and FIG. 5B which covers the periphery of a fuse element in the semiconductor integrated circuit device as well. Illustrated in FIG. 7 is an example in which a three-metal wiring layer process is used as in the first to sixth embodiments.

The NMOS transistor 401 and wiring in the surroundings thereof, the fuse element 301, and the bonding pad 19 are illustrated in FIG. 7 as in the fifth embodiment. The NMOS transistor 401 and the bonding pad 19 are the same as the ones in the fifth embodiment. The fuse element 301 is an application of the third embodiment and is formed from a layered film in which the amorphous silicon layer 17 and the high-melting point metal film 18 such as a TiN film are stacked. A layered film in which the third metal wiring layer 14 made from an Al film or the like and the anti-reflection film 23 made of high-melting point metal such as TiN are stacked is disposed at the ends of the fuse element 301. The fuse element 301 is connected to the internal circuit from this layered film through the via hole 15 by the second metal wiring layer 11.

The anti-reflection film is layered only on the third metal wiring layer at the ends of the fuse element 301 as in the fifth embodiment. The anti-reflection film is removed from above the third metal wiring layer of the bonding pad 19 and from above the third metal wiring layer of the internal circuit, which includes the NMOS transistor 401.

The final protective film, which is the topmost layer and is made up of the silicon oxide film 24 and the silicon nitride film 25, has an opening only above the bonding pad 19 in order to lead out a terminal.

As has been described, the seventh embodiment of the present invention is capable of providing a low-resistance fuse element that is superior in long-term reliability and that is reduced in manufacturing cost because steps of forming and processing an additional interlayer insulating film are unnecessary, and providing a semiconductor integrated circuit device that includes the fuse element.

Eighth Embodiment

Figure 8:
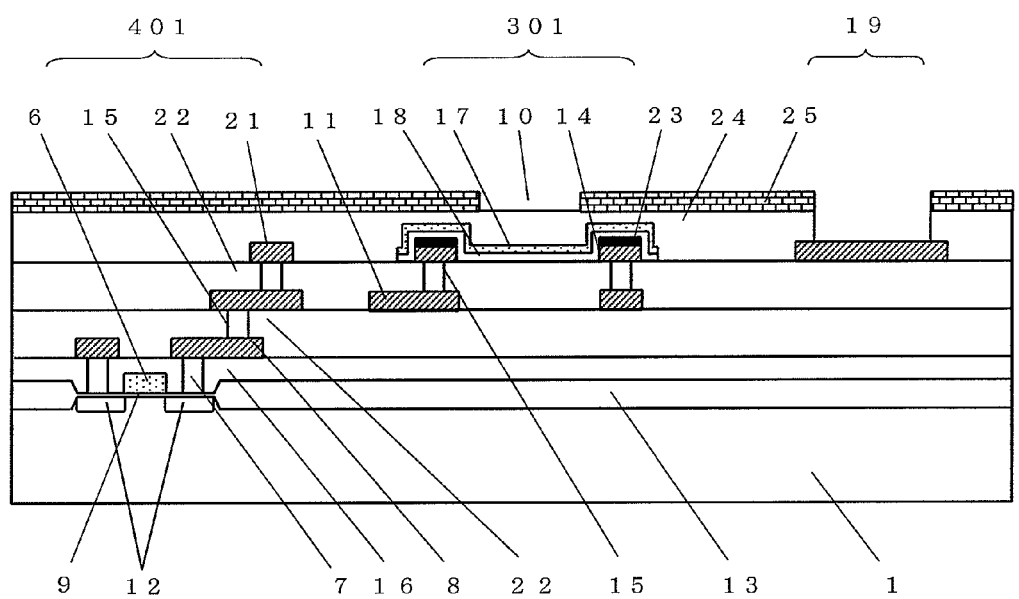
FIG. 8 is a schematic sectional view of an eighth embodiment of the present invention.

FIG. 8 is a schematic sectional view of an eighth embodiment of the present invention as an application of the fourth embodiment illustrated in FIG. 6A and FIG. 6B which covers the periphery of a fuse element in the semiconductor integrated circuit device as well. Illustrated in FIG. 8 is an example in which a three-metal wiring layer process is used as in the first to seventh embodiments.

The NMOS transistor 401 and wiring in the surroundings thereof, the fuse element 301, and the bonding pad 19 are illustrated in FIG. 8 as in the seventh embodiment. The structures themselves of the NMOS transistor 401, the bonding pad 19, and the fuse element 301 are the same as the ones in the seventh embodiment. In the eighth embodiment, an opening is formed in both of the silicon oxide film 24 and the silicon nitride film 25, which constitute a two-layer final protective film, in the bonding pad 19 by dry etching, whereas an opening is formed only in the silicon nitride film in a portion of the final protective film that is above the fuse element. In the case where a final protective film that is thick for a manufacturing-related reason hinders the transmission of a laser used for fuse cutting and impairs the ease of laser processing of the fuse element as described in the fourth embodiment, a fuse opening photomask in the final protective film is prepared and processed separately from a bonding pad opening mask in this manner.

As has been described, the eighth embodiment of the present invention is capable of realizing a semiconductor integrated circuit device including a low-resistance fuse element, in which the ease of fuse cutting processing is stable even when the final protective film is too thick to transmit a laser for fuse cutting, and the long-term reliability is high.

Ninth Embodiment

A method of manufacturing the semiconductor integrated circuit device of the fifth embodiment is described below as a ninth embodiment of the present invention with reference to FIG. 15A to FIG. 15C and FIG. 16A to FIG. 16C.

Figure 15A:
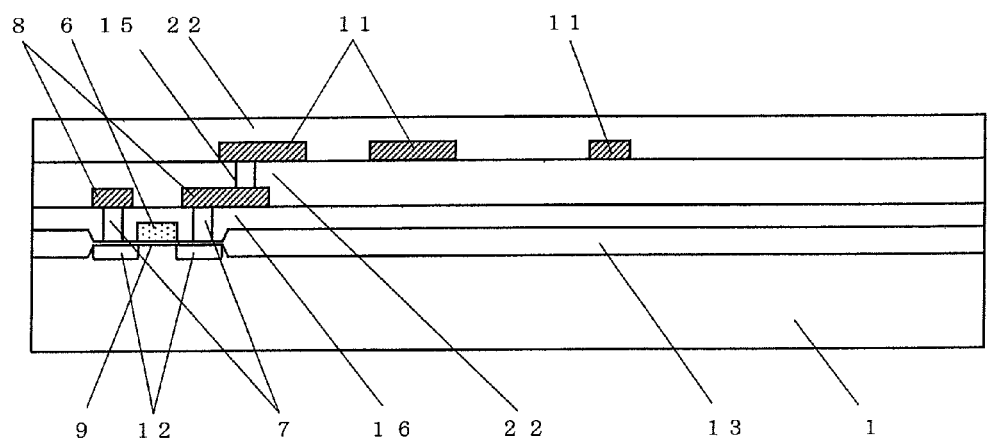
FIG. 15A to FIG. 15C are process flow sectional views of the fifth embodiment of the present invention.

First, a MOS transistor is fabricated on a semiconductor substrate 1 by forming an element isolation region such as an LOCOS insulating film 13, the gate insulating film 9, the gate electrode 6, and the source/drain region 12. Formed next are a planarization insulating film such as the BPSG film 16, the contact holes 7 in the BPSG film, the first metal wiring layer 8, the interlayer insulating film 22 above the first metal wiring layer 8, the via hole 15 in the interlayer insulating film 22 that connects the first metal wiring layer and the second metal wiring layer, the second metal wiring layer 11, and the interlayer insulating film 22 above the second metal wiring layer 11 (FIG. 15A).

The first metal wiring layer and the second metal wiring layer are formed by using Al doped with Si or Cu, or just Cu, as the metal of a conductor, disposing a barrier metal that is made of high-melting point metal such as Ti or TiN on the bottom surface of the conductor, and layering an anti-reflection film that is made of high-melting point metal such as TiN on the top surface of the conductor. Details on the structure and forming method of the first metal wiring layer and the second metal wiring layer are omitted here. In short, the ninth embodiment employs a common manufacturing method that includes forming the metal wiring described above, and is not limited to a special manufacturing process. The illustration of the ninth embodiment is also simplified.

Figure 15B:
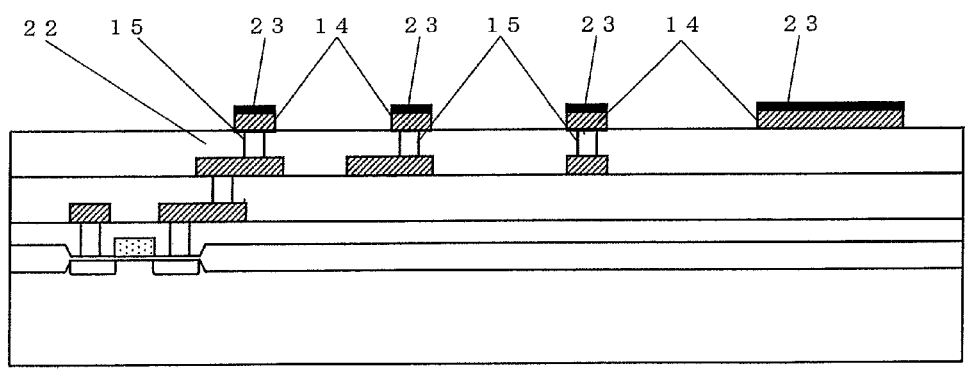

Next, the via holes 15 in the interlayer insulating film 22 that connect the second metal wiring layer and the third metal wiring layer are formed, and the third metal wiring layer 14 is formed (FIG. 15B).

A common method is employed to form the detailed structure of the third metal wiring layer. The anti-reflection film 23 made of a high-melting point metal such as TiN which is indispensable in the present invention, on the other hand, is specially shown in the drawings. At the time the processing of the third metal wiring layer is finished, the anti-reflection film 23 remains layered on all portions of the third metal wiring layer.

Figure 15C:
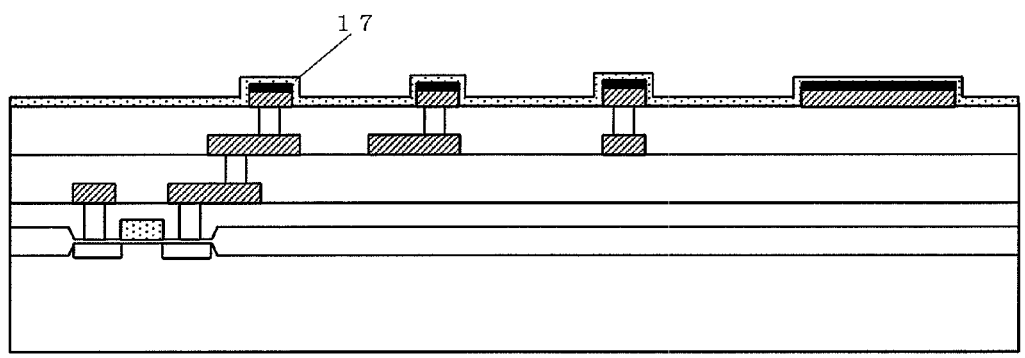

The amorphous silicon layer 17, which is a characteristic component of the present invention, is layered next over the entire surface of the semiconductor substrate by sputtering (FIG. 15C).

Figure 16A:
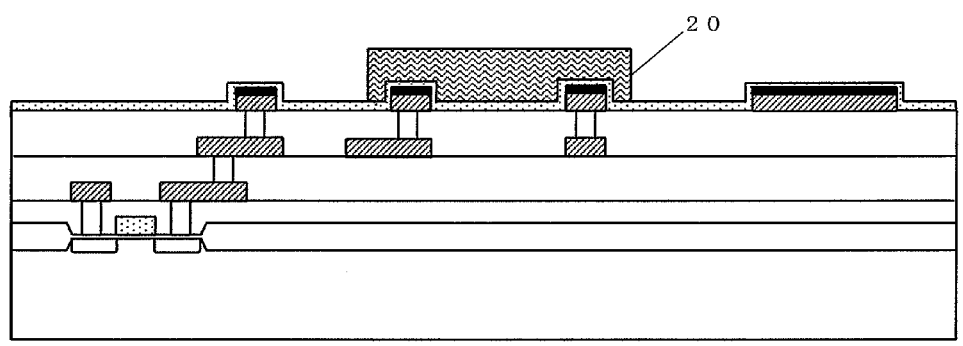
FIG. 16A to FIG. 16C are process flow sectional views of the fifth embodiment of the present invention that are for illustrating steps subsequent to the steps FIG. 15A to FIG. 15C.

Photo resist 20 is applied next, and then removed by photolithography from other regions than a fuse element forming-scheduled region (FIG. 16A).

With the photo resist 20 as a mask, all portions of the amorphous silicon layer 17 except a portion for the fuse element are removed by dry etching. At this point, the same mask is used to simultaneously remove the remaining high-melting point metal film such as a TiN film from above all portions of the third metal wiring layer except a portion for the fuse element. In this manner, -only portions of the anti-reflection film in wiring connection portions at the ends of the fuse element remain on the third metal wiring layer.

Figure 16B:
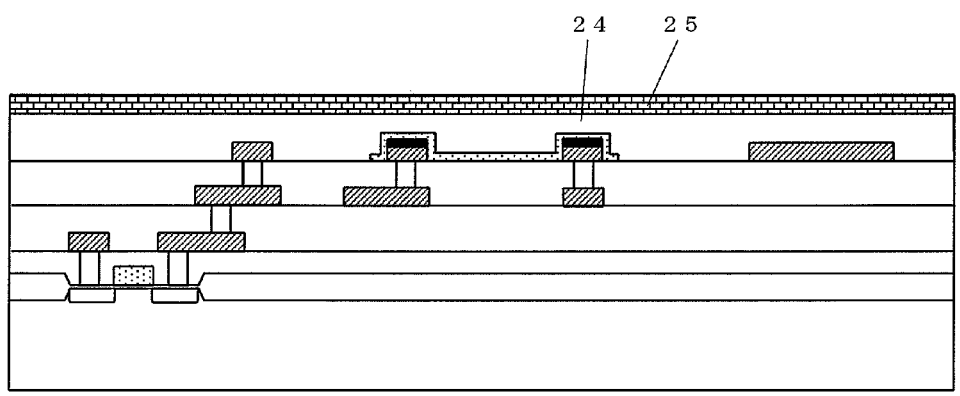

The silicon oxide film 24 and the silicon nitride film 25 are formed next in order as a final protective film (FIG. 16B).

Figure 16C:
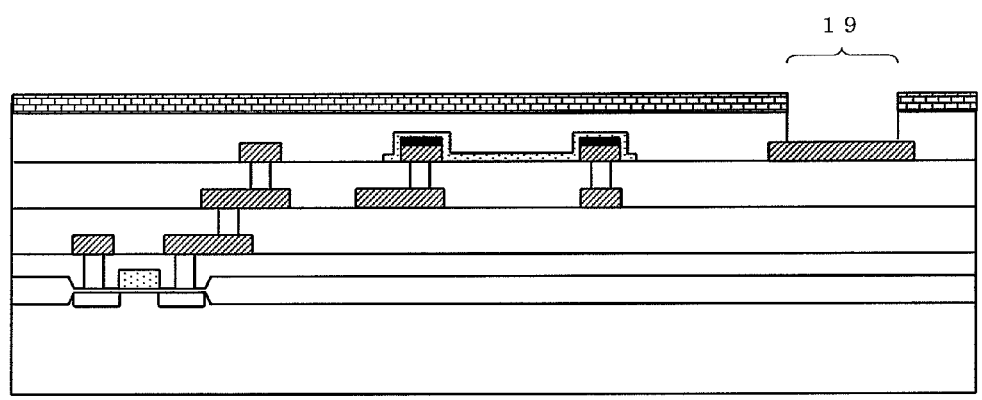
Figure 17A:
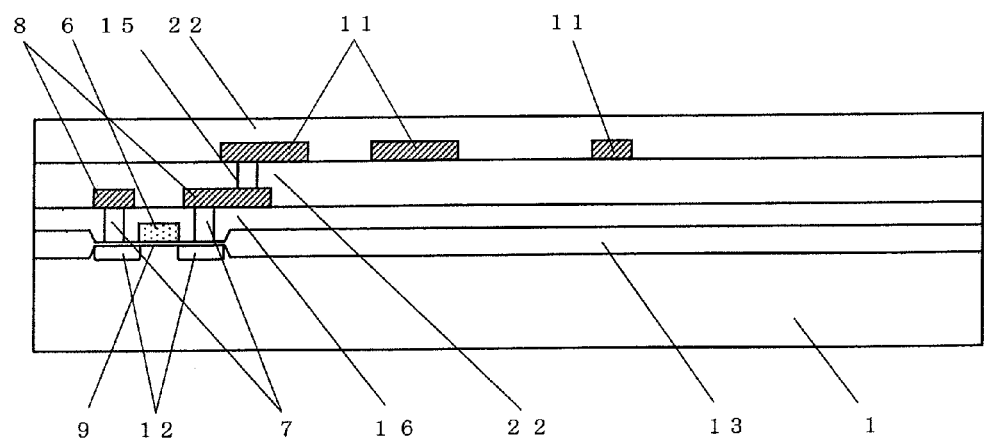
FIG. 17A to FIG. 17C are process flow sectional views of the sixth embodiment of the present invention.
Figure 17B:
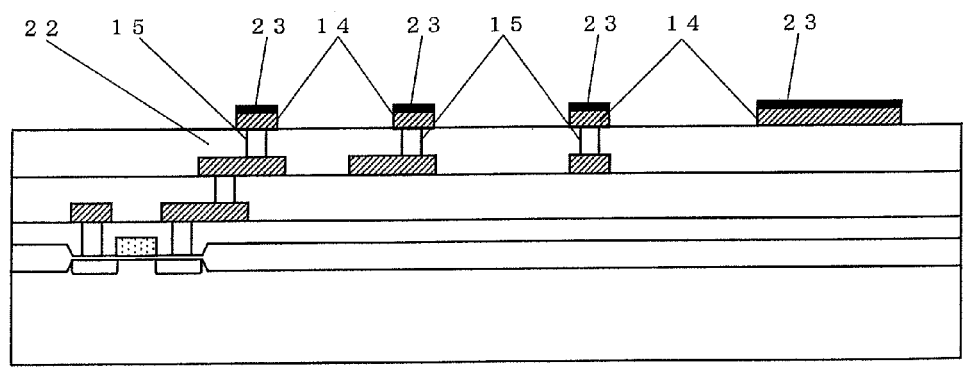
Figure 17C:
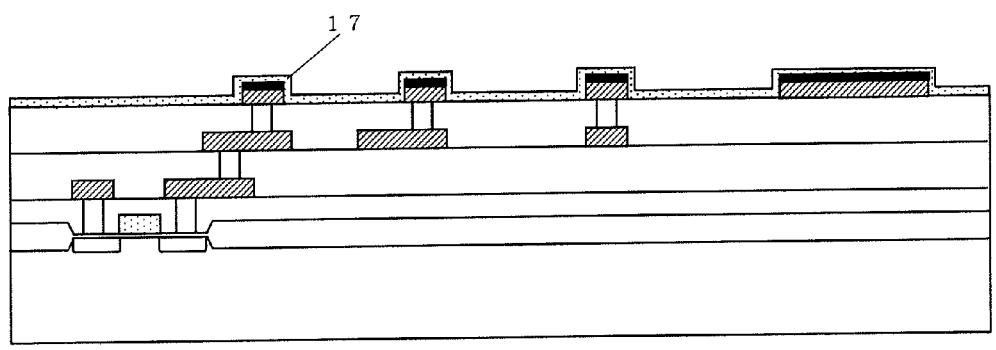

Lastly, an opening is formed in a portion of the final protective film that is above the bonding pad 19 through which electrical connection to an external terminal is made, by sequentially etching the silicon nitride film and the silicon oxide film in this portion through dry etching (FIG. 16C).

As has been described, the present invention employs a manufacturing method that adds a step of forming a fuse element after a step of forming the last metal film, and does not use a special film for the fuse element itself, which make the present invention flexibly applicable to various semiconductor manufacturing processes.

Tenth Embodiment

A method of manufacturing the semiconductor integrated circuit device of the sixth embodiment is described below as a tenth embodiment of the present invention with reference to FIG. 17A to FIG. 17C and FIG. 18A to FIG. 18C. The structural difference of the sixth embodiment from the fifth embodiment resides in the openings in the final protective film. The manufacturing method in this embodiment is accordingly the same as the method of manufacturing the semiconductor integrated circuit device of the fifth embodiment in the step of forming components on the semiconductor substrate 1 up through the interlayer insulating film 22 that is above the second metal wiring layer 11 (FIG. 17A), the step of forming the third metal wiring layer 14 with the use of the anti-reflection film 23 (FIG. 17B), the step of forming the amorphous silicon layer 17 for the fuse element by deposition (FIG. 17C), the step of patterning resist to process the fuse element (FIG. 18A), the step of processing the fuse element by etching, and the step of forming by deposition the final protective film that is made up of a silicon oxide film and a silicon nitride film.

Figure 18A:
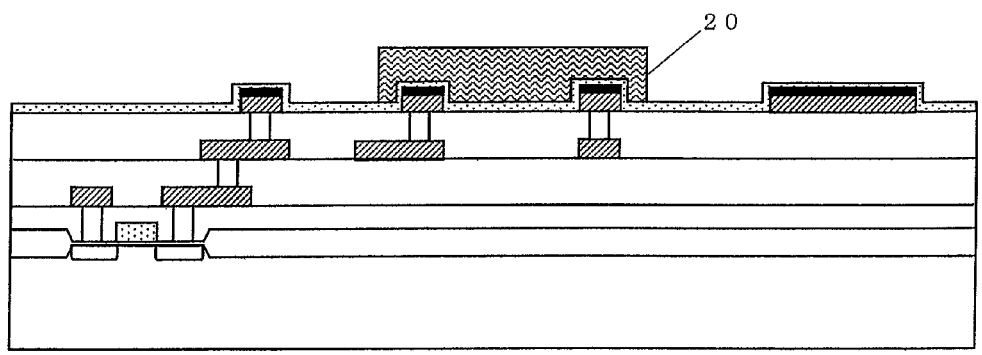
FIG. 18A to FIG. 18C are process flow sectional views of the sixth embodiment of the present invention that are for illustrating steps subsequent to the steps FIG. 17A to FIG. 17C.
Figure 18B:
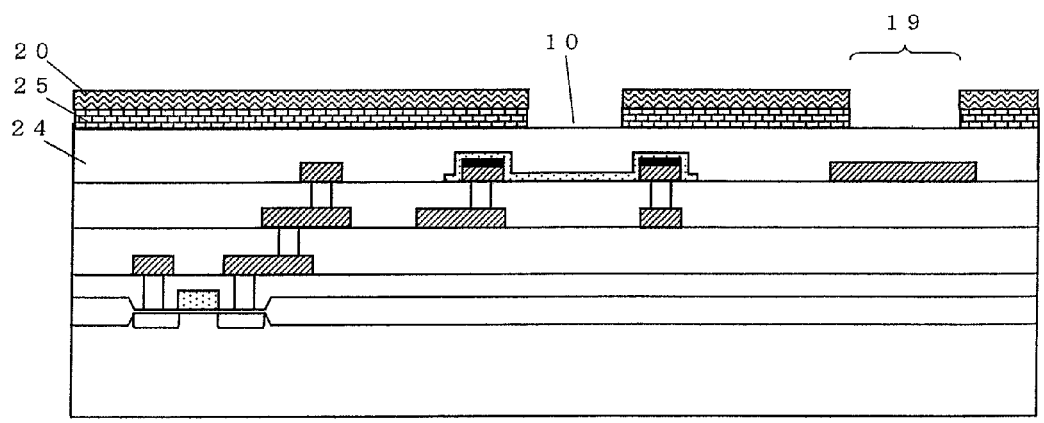

In the next step where the final protective film is processed, the resist 20 that is patterned is formed first on the silicon nitride film. The resist 20 is a pattern that has openings in places, specifically above the fuse element region and above the bonding pad region. The silicon nitride film 25 is selectively etched away with this resist 20 as a mask, to thereby form the laser fuse cutting opening 10 in the fuse element region and an opening in the bonding pad 19 region simultaneously (FIG. 18B).

Figure 18C:
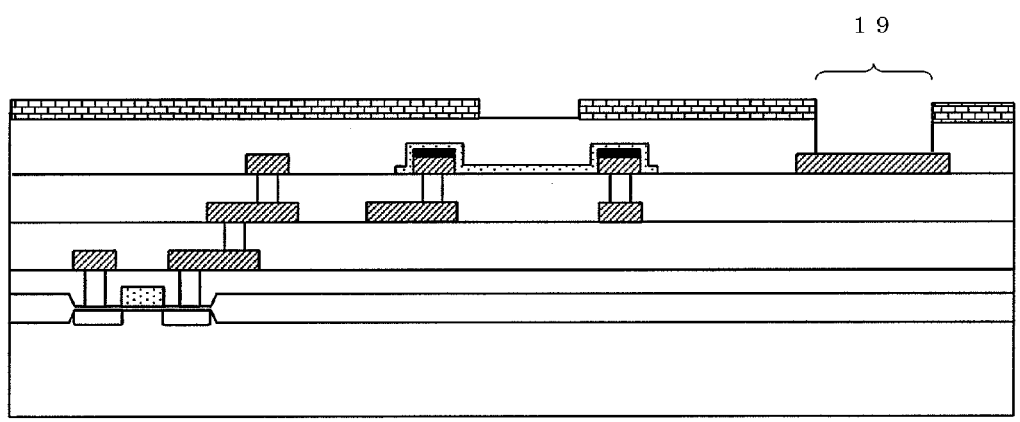

Another piece of photo resist and another photomask are used to remove by etching the silicon oxide film only from above the bonding pad 19 (FIG. 18C).

The final protective film can be processed by a first processing method in which the application of the first photo resist for processing the silicon nitride film, the forming of openings in the first photo resist above the silicon nitride film, and the removal by etching of the silicon nitride film are followed by the removal of the first resist, the application of the second photo resist, the forming of openings in the second photo resist above the silicon oxide film, the removal by etching of the silicon oxide film, and the removal of the second photo resist.

A second processing method may instead be employed to process the final protective film. In the second processing method, the first photo resist is not removed after the steps of applying the first photo resist, forming openings in the first photo resist above the silicon nitride film, and removing the silicon nitride film by etching are executed, and the application of the second photo resist, the forming of openings in the second photo resist above the silicon oxide film, the removal of the silicon oxide film, and the removal of the first photo resist and the second photo resist are executed subsequently. The second processing method for the final protective film is advantageous in that removing the first photo resist and the second photo resist at once in the last step has an effect of eliminating damage to the silicon nitride film at the edge of the bonding pad opening, as well as an effect of reducing the number of manufacturing steps.

In the first processing method for the final protective film, a silicon oxide film residue left in the bonding pad opening due to misalignment of the opening in the second photo resist is prevented by making the opening in the second photo resist wider than the opening in the silicon nitride film which has already been formed. The silicon oxide film is then removed by etching with the exposed opening in the silicon nitride film as a mask. When the opening is formed in the second photo resist, damage from the etching of the silicon oxide film to the exposed portion of the silicon nitride film in the bonding pad is unavoidable. In the case where there is a concern that employing the first processing method may accelerate the seeping of moisture or the like at the edge of the bonding pad that leads to the decline in long-term reliability, the concern is eliminated by employing the second processing method to process the final protective film.

In the second processing method for the final protective film, the etching of the silicon nitride film is followed immediately by the covering of the second photo resist. An opening wider than the opening in the silicon nitride film is then formed in the second photo resist as in the first processing method. At this point, the first photo resist underneath which has been cured by the previous plasma etching treatment of the silicon nitride film remains as it is, and the cured first photo resist can be utilized as an opening mask in the next step of etching the silicon oxide film. Damage to the silicon nitride film from the etching of the underlying layer can thus be prevented.

In the case where the first photo resist utilized in the etching has not been cured enough and is easily dissolved by solvents of photo resist, performing UV curing treatment before the second photo resist is applied is recommended. The UV curing treatment advances the curing to the inside of the first photo resist, thereby making the first photo resist hardly soluble, and eliminates the concern that the pattern of the first photo resist may lose shape due to a solvent of the second photo resist. Another effect is that the subsequent removal of the first photo resist and the second photo resist is made easy.

The present invention, which employs the method described above, is capable of providing a method of manufacturing a semiconductor integrated circuit device that is superior in long-term reliability and that is improved in the ease of laser cutting of a fuse element by removing the anti-reflection film from the bonding pad opening and by avoiding etching damage at the edge of the bonding pad opening.

Eleventh Embodiment

A method of manufacturing the semiconductor integrated circuit device of the seventh embodiment is described below as a eleventh embodiment of the present invention with reference to FIG. 9A to FIG. 9C and FIG. 10A to FIG. 10C. The method of manufacturing the semiconductor integrated circuit device of the seventh embodiment is a manufacturing method in which the fuse element used in the fifth embodiment is given a layered structure that is made up of an amorphous silicon layer and a high-melting point metal as in the third embodiment.

Figure 9A:
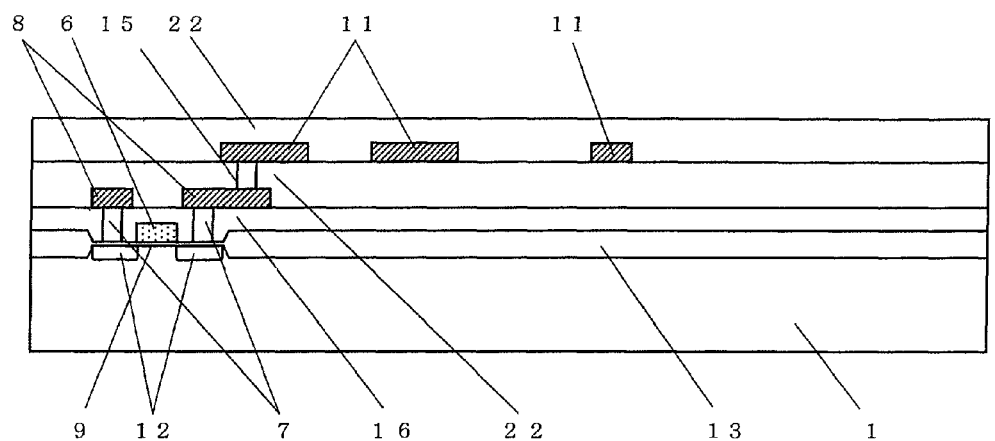
FIG. 9A to FIG. 9C are process flow sectional views of the seventh embodiment of the present invention.
Figure 9B:
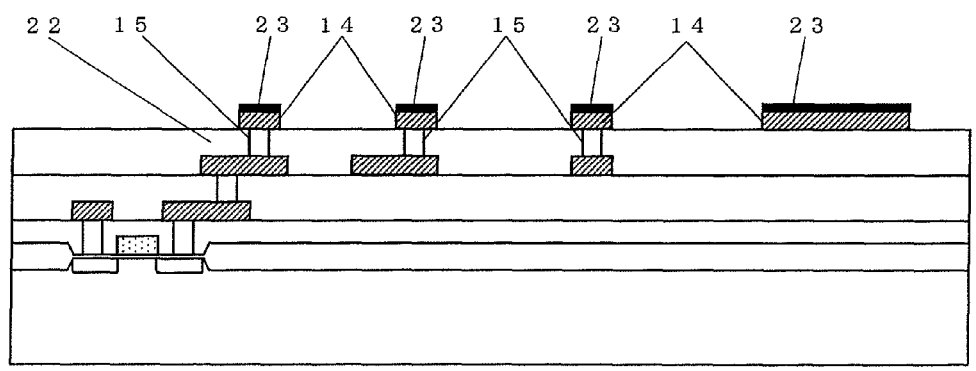

The manufacturing process in the eleventh embodiment is therefore the same as the one in the previous embodiment in the step of forming components on the semiconductor substrate 1 up through the interlayer insulating film 22 that is above the second metal wiring layer 11 (FIG. 9A), and the step of forming the third metal wiring layer 14 with the use of the anti-reflection film 23 (FIG. 9B).

Figure 9C:
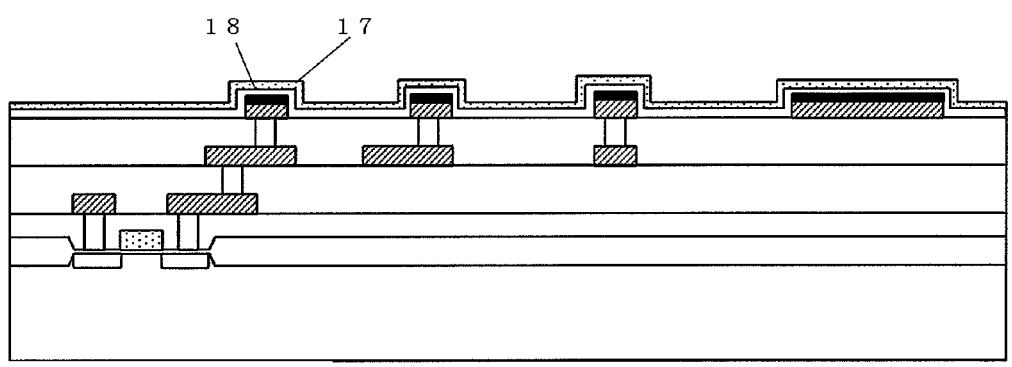

Next, the high-melting point metal film 18 made of TiN or the like and then the amorphous silicon layer 17 are formed by sputtering over the entire surface of the semiconductor substrate to be stacked on top of each other (FIG. 9C).

A step of patterning resist to process the fuse element (FIG. 10A) is executed next. With the same photo resist as a mask, the amorphous silicon layer 17 and the high-melting point metal film 18 are processed by etching. In the etching, the anti-reflection film is also removed from above the third metal wiring layer in other regions than the fuse element region by etching with the use of the same photo resist mask.

Figure 10A:
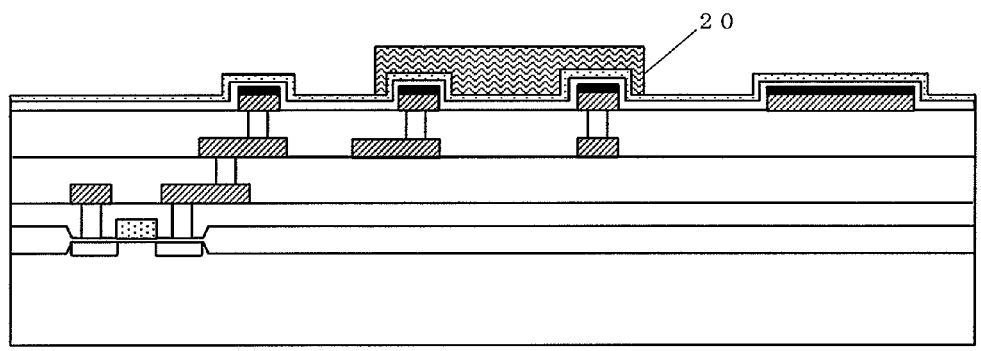
FIG. 10A to FIG. 10C are process flow sectional views of the seventh embodiment of the present invention that are for illustrating steps subsequent to the steps FIG. 9A to FIG. 9C.
Figure 10B:
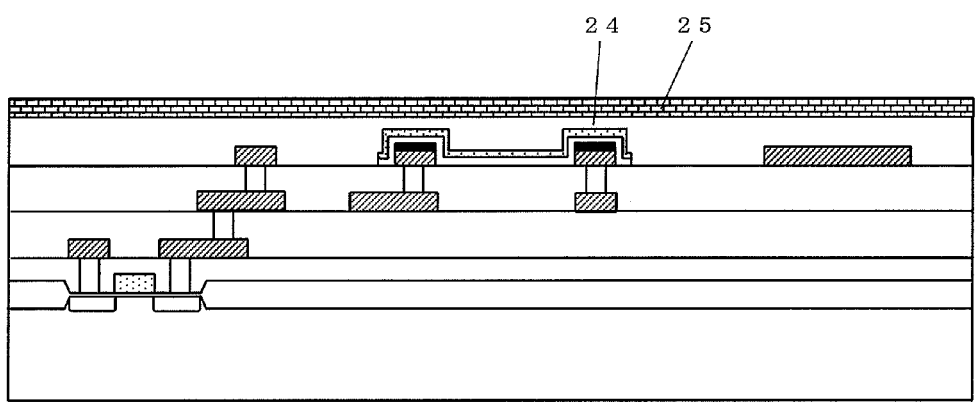
Figure 10C:
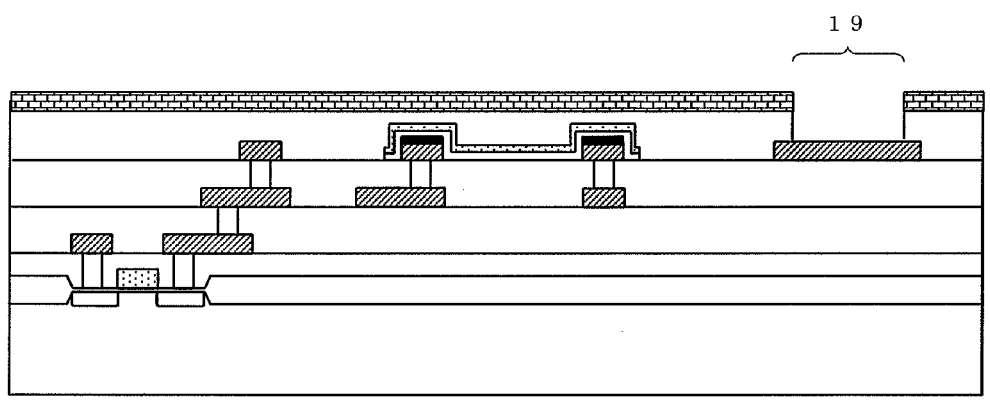
Figure 11A:
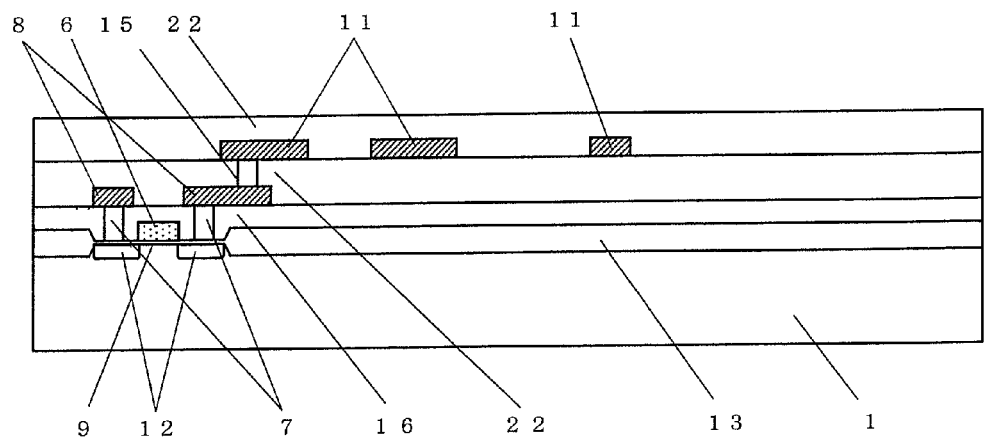
FIG. 11A to FIG. 11C are process flow sectional views of the eighth embodiment of the present invention.
Figure 11B:
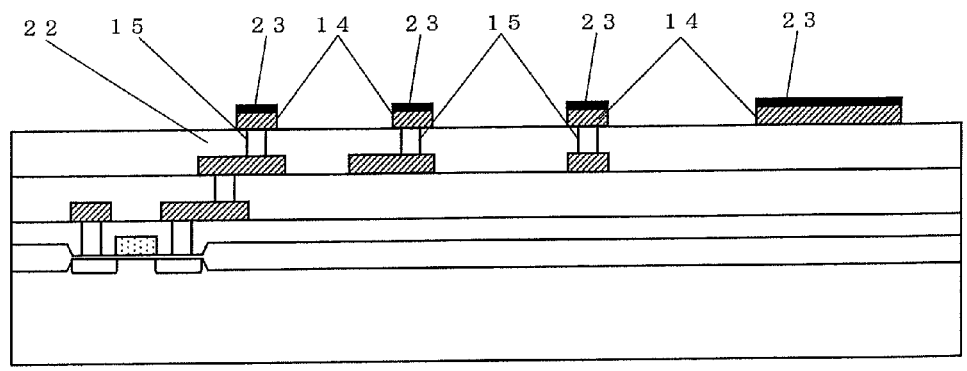
Figure 11C:
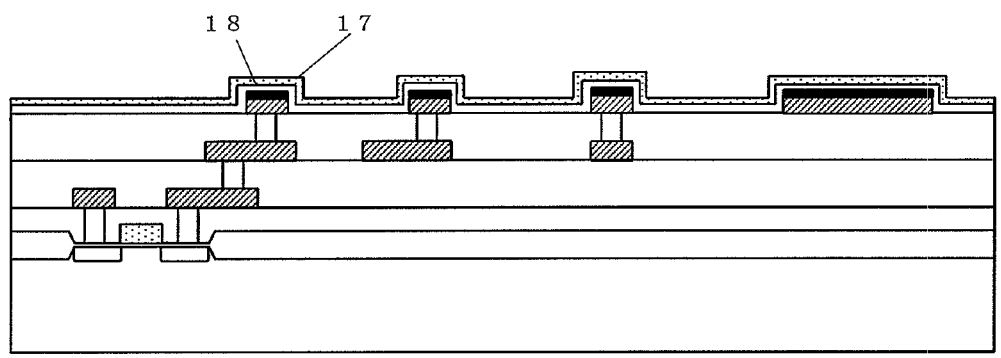

Thereafter, a step of forming by deposition the final protective film that is made up of a silicon oxide film 24 and a silicon nitride film 25 is executed (FIG. 10B), followed by a step of removing the final protective film from above the bonding pad 19(FIG. 10C). These steps are the same as the ones in the method of manufacturing the semiconductor integrated circuit device of the fifth embodiment.

Twelfth Embodiment

A method of manufacturing the semiconductor integrated circuit device of the eighth embodiment is described below as a twelfth embodiment of the present invention with reference to FIG. 11A to FIG. 11C and FIG. 12A to FIG. 12C. The structural difference of the eighth embodiment from the seventh embodiment resides in the openings in the final protective film. The manufacturing method in this embodiment is accordingly the same as the method of manufacturing the semiconductor integrated circuit device of the seventh embodiment in the step of forming components on the semiconductor substrate 1 up through the interlayer insulating film 22 that is above the second metal wiring layer 11 (FIG. 11A), the step of forming the third metal wiring layer 14 with the use of the anti-reflection film 23 (FIG. 11B), the step of forming by deposition the high-melting point metal film 18 and the amorphous silicon layer 17 for the fuse element (FIG. 11C), the step of patterning resist to process the fuse element (FIG. 12A), the step of processing the fuse element by etching, and the step of forming by deposition the final protective film that is made up of a silicon oxide film and a silicon nitride film.

Figure 12A:
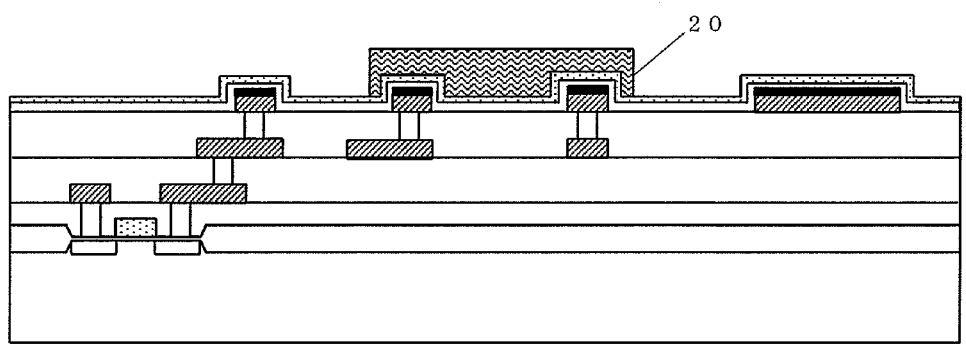
FIG. 12A to FIG. 12C are process flow sectional views of the eighth embodiment of the present invention that are for illustrating steps subsequent to the steps FIG. 11A to FIG. 11C.
Figure 12B:
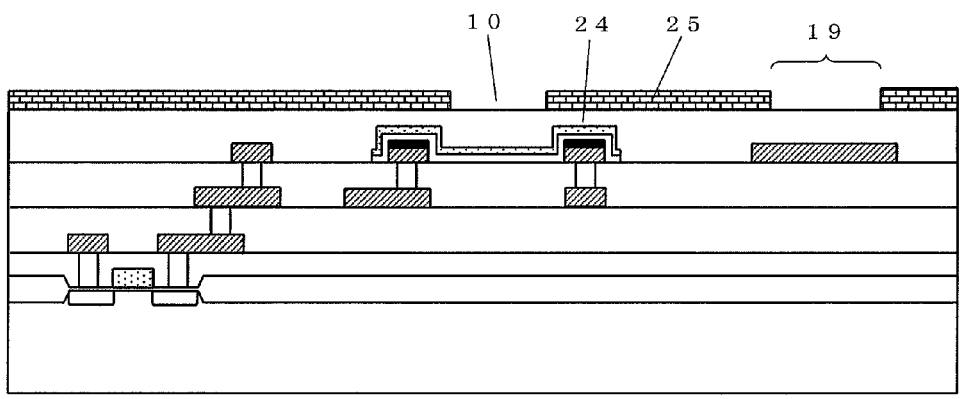

In the next step where the final protective film is processed, the silicon nitride film 25, which is the upper layer out of the final protective film, is removed by etching with the use of the same photo resist from above the fuse element and from above the bonding pad. The laser fuse cutting opening 10 and the opening above the bonding pad 19 are formed in this manner (FIG. 12B).

Figure 12C:
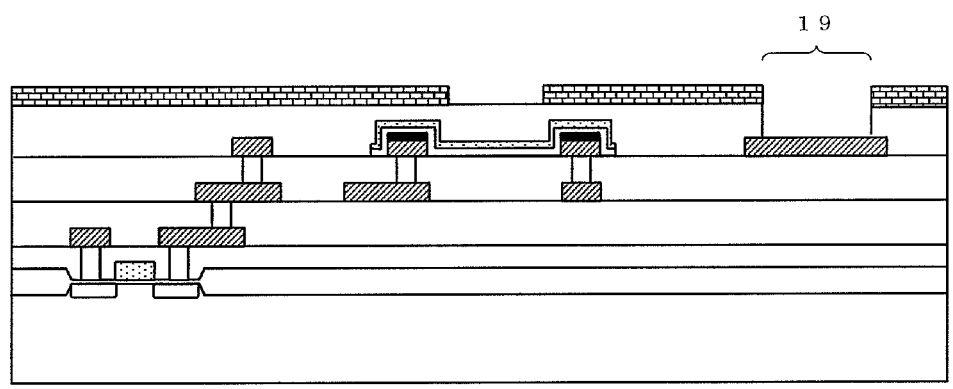

Another piece of photo resist and another photomask are used to remove by etching the silicon oxide film only from above the bonding pad 19 (FIG. 12C).

As a method of processing the final protective film in further detail, any of the first processing method and the second processing method in the method of manufacturing the semiconductor integrated circuit device of the sixth embodiment can be employed. In the first processing method, the silicon oxide film is removed by etching with the use of the second photo resist after the first photo resist is removed. In the second processing method, the first photo resist remains during the removal of the silicon oxide film by etching with the use of the second photo resist.

The high-melting point metal in the description given above is not limited to Ti or TiN, and can be other Ti compounds.

The application of the present invention, which uses the structures and manufacturing methods described above, is not limited to step-down series regulators and voltage detectors mentioned in the description given above, and the present invention is applicable to every product configured to adjust the performance of a semiconductor integrated circuit by fuse cutting. The present invention can accordingly be applied to other uses than power management ICs.

What is claimed is:

1. A method of manufacturing a semiconductor integrated circuit device comprising a fuse element, the method comprising:
    forming an insulating film on a semiconductor substrate;
    layering on the insulating film a first metal film and a first high-melting point metal film in the order stated;
    etching the first metal film and the first high-melting point metal film to form, in a fuse element region, two conductors in which the first high-melting point metal film is placed on top of the first metal film and which are spaced apart from each other, and to form a bonding pad in a bonding pad region;
    forming an amorphous silicon layer by deposition on the two conductors, the bonding pad, and the insulating film;
    forming, in the fuse element region, a fuse element from the amorphous silicon layer, which is formed in a region above the insulating film where the two conductors are spaced apart from each other, and is configured to cover a top surface of the first high-melting point metal film and side surfaces of the two conductors;
    removing the amorphous silicon layer and the first high-melting point metal film from the bonding pad region;
    forming, by deposition, over the semiconductor substrate that comprises the fuse element, a protective film in which a silicon oxide film constitutes a lower layer and a silicon nitride film constitutes an upper layer; and
    removing the protective film from above the bonding pad.

2. A method of manufacturing a semiconductor integrated circuit device according to claim 1, wherein, in removing the protective film, the silicon nitride film is removed from above the fuse element.

3. A method of manufacturing a semiconductor integrated circuit device according to claim 1, further comprising forming a second high-melting point metal film by deposition, prior to the forming of the amorphous silicon layer by deposition,
    wherein, in forming the fuse element, the fuse element is formed in the fuse element region from the second high-melting point metal film and from the amorphous silicon layer, which is formed in a region above the insulating film where the two conductors are spaced apart from each other, and is configured to cover a top surface of the first high-melting point metal film and side surfaces of the two conductors.

4. A method of manufacturing a semiconductor integrated circuit device according to claim 1, wherein the first high-melting point metal film comprises one of a TiN film and a Ti compound film.

5. A method of manufacturing a semiconductor integrated circuit device according to claim 3, wherein the second high-melting point metal film comprises one of a TiN film and a Ti compound film.

6. A method of manufacturing a semiconductor integrated circuit device according to claims 1, wherein the amorphous silicon layer is set to have a thickness of 150 Å or more and 1,000 Å or less.

7. A method of manufacturing a semiconductor integrated circuit device that comprises a fuse element, comprising:
 forming an insulating film on a semiconductor substrate;
 layering on the insulating film a first metal film and a first high-melting point metal film in the order stated;
 etching the first metal film and the first high-melting point metal film to form, in a fuse element region, two conductors in which the first high-melting point metal film is placed on top of the first metal film and which are spaced apart from each other;
 forming an amorphous silicon layer by deposition on the two conductors and the insulating film;
 forming, in the fuse element region, a fuse element from the amorphous silicon layer, which is formed in a region above the insulating film where the two conductors are spaced apart from each other, and is configured to cover a top surface of the first high-melting point metal film and side surfaces of the two conductors;
 forming an interlayer insulating film above the first metal film;
 forming a second metal film above the interlayer insulating film;
 etching the second metal film to form a bonding pad in a bonding pad region;
 forming, by deposition, over the semiconductor substrate that comprises the fuse element, a protective film in which a silicon oxide film constitutes a lower layer and a silicon nitride film constitutes an upper layer; and
 removing the protective film from above the bonding pad.

* * * * *